(12) United States Patent
Karasawa et al.

(10) Patent No.: US 7,001,778 B2
(45) Date of Patent: Feb. 21, 2006

(54) METHOD OF MAKING LAYERED SUPERLATTICE MATERIAL WITH IMPROVED MICROSTRUCTURE

(75) Inventors: Junichi Karasawa, Nagano-ken (JP); Vikram Joshi, Colorado Springs, CO (US)

(73) Assignees: Symetrix Corporation, Colorado Springs, CO (US); Seiko Epson Corporation, Tokyo (JP)

( * ) Notice: Subject to any disclaimer, the term of this patent is extended or adjusted under 35 U.S.C. 154(b) by 17 days.

(21) Appl. No.: 10/415,175

(22) PCT Filed: Oct. 30, 2001

(86) PCT No.: PCT/US01/45392

§ 371 (c)(1),
(2), (4) Date: Sep. 12, 2003

(87) PCT Pub. No.: WO02/073669

PCT Pub. Date: Sep. 19, 2002

(65) Prior Publication Data

US 2004/0048455 A1    Mar. 11, 2004

Related U.S. Application Data

(60) Provisional application No. 60/244,809, filed on Oct. 31, 2001, provisional application No. 60/285,123, filed on Apr. 20, 2001, provisional application No. 60/274,465, filed on Mar. 9, 2001.

(51) Int. Cl.
*H01L 21/00* (2006.01)
(52) U.S. Cl. .......................... 438/3; 438/502
(58) Field of Classification Search .............. 438/3, 438/238, 240, 502
See application file for complete search history.

(56) References Cited

U.S. PATENT DOCUMENTS 5,046,043 A * 9/1991 Miller et al. ............... 257/295

(Continued)

FOREIGN PATENT DOCUMENTS

DE           10019822 A1    10/2001

OTHER PUBLICATIONS

Ogata, N. et al: "Fine-Graned SRBI2TA209 Thin Films By Low Temperature Annealing", Extended Abstracts of The International Conference On Solid State Devices And Materials, Japan Society Of Applied Physics. Tokyo, Japan, Sep. 1, 1997, pp. 40-41, XP000728016.

(Continued)

*Primary Examiner*—Chandra Chaudhari
(74) *Attorney, Agent, or Firm*—Patton Boggs LLP

(57) ABSTRACT

In the manufacture of an integrated circuit, a first electrode (48) is formed on a substrate (28). In a first embodiment, a strontium bismuth tantalate layer (50) and a second electrode (52) are formed on top of the first electrode (48). Prior to the final crystallization anneal, the first electrode (48), the strontium bismuth tantalate layer (50) and the second electrode (52) are patterned. The final crystallization anneal is then performed on the substrate (28). In a second embodiment, a second layer (132) of strontium bismuth tantalate is deposited on top of the strontium bismuth tantalate layer (50) prior to the forming of the second electrode (52) on top of the first and second layers (50), (132). In a third embodiment, a carefully controlled UV baking process is performed on the strontium bismuth tantalate layer (50). In a fourth embodiment, an additional rapid thermal annealing process is performed on a substrate subsequent to the patterning process and prior to the final crystallization annealing process.

71 Claims, 11 Drawing Sheets

U.S. PATENT DOCUMENTS

| | | | |
|---|---|---|---|
| 5,418,389 A | * | 5/1995 | Watanabe .................. 257/295 |
| 5,853,500 A | | 12/1998 | Joshi et al. |
| 5,942,376 A | * | 8/1999 | Uchida et al. .............. 430/330 |
| 6,022,669 A | | 2/2000 | Uchida et al. |
| 6,133,050 A | * | 10/2000 | Azuma et al. ................ 438/3 |

OTHER PUBLICATIONS

Horikawa, T. et al: Effects Of Post-Annealing On Dielectric Properties Of (BA, SR) TI03 Thin Films Prepared By Liquid Source Chemical Vapor Deposition, IEICE Transactions On Electronics, Institutes Of Electronics Information And Comm. Eng., Tokyo, Japan, vol. E81-C, No. 4, Apr. 1998, pp. 497-503, XP00083374, ISSN: 0916-8524.

Shimakawa, Y. et al: "Crystal Structures And Ferroelectric Properties Of SRBI2TA209 And SRO.BB12.2TA209", Applied Physics Letters, American Institute Of Physics New Yor, US. Vol. 74, NO. 13, Mar. 29, 1999, pp. 1904-1906, xp000827171, ISSN: 0003-6951.

* cited by examiner

US 7,001,778 B2

METHOD OF MAKING LAYERED SUPERLATTICE MATERIAL WITH IMPROVED MICROSTRUCTURE

This application is a national stage entry of PCT/US01/45392, with international filing date Oct. 30, 2001 which claims priority from provisional application 60/244,809 filed Oct. 31, 2000 which claims priority from provisional application 60/274,465 filed Mar. 9, 2001 which claims priority from provisional application 60/285,123 filed Apr. 20, 2001.

BACKGROUND OF INVENTION

1. Field of the Invention

This invention pertains to the fabrication of integrated circuits utilizing thin film layered superlattice material, and more particularly to processes for improving the microstructure of such thin films.

2. Statement of the Problem

Layered superlattice material thin films have been a very strong candidate for high density ferroelectric random access memories (FeRAMs). However, some problems in the layered superlattice material thin film have been pointed out, such as low remnant polarization (Pr), high crystallization temperature and surface roughness in comparison to $Pb(Zr,Ti)O_3$ (PZT) thin films. Especially, the roughness of layered superlattice material thin films, in other words, high porosity of layered superlattice material thin films, causes some damage during layered superlattice material thin film patterning processes, leading to ferroelectric memories with poor reliability.

Typically, layered superlattice material thin films are patterned after the layered superlattice material thin film material has been subjected to a final crystallization anneal in a furnace. This is believed to be necessary in the prior art. In addition, it is known that in the chemical solution deposition (CSD) process, both electrical properties of layered superlattice material and crystallinity of these materials including surface morphology, crystal orientation, etc., are affected by the baking process. During the baking (drying) process of as-coated wet thin films, which are usually carried out on a hot plate, metalorganics in wet thin film can be partially or fully decomposed. In the prior art, surface roughness improvement by adjusting these process parameters has always been obtained at the expense of polarizability, the key property for ferroelectricity. Thus, the choice was good microstructure of the integrated circuit or high polarizability.

Ultraviolet radiation has been known to be effective in assisting chemical reactions in forming thin films. For example, see Japanese Patent Application No. 61183921 of Kamei; Japanese Patent Publication No. 60-128264 (NEC Corp.); U.S. Pat. No. 4,811,684 issued to Tashiro et al.; U.S. Pat. No. 4,683,147 issued to Eguchi et al.; Japanese Patent Publication No. 62-22420; and A. Yamada, Y. Jia, M. Konagai, and K. Takahashi, "Photochemical Vapor Deposition of $Si/Si_{1-x}Ge_x$ Strained Layer Superlattices at 250° C.", *Japanese Journal of Applied Physics*, Vol. 27, No. 11, November 1988, pp. L2174–L2176. However, while UV has been found to improve the decomposition of the precursor and improve certain crystallization factors, it also has been found to decrease polarizability. There remains a need during the fabrication of integrated circuits to improve the exposure and benefits of UV radiation versus the contrary effect on polarization characteristics of the layered superlattice material.

SUMMARY OF THE INVENTION

The invention overcomes the problems of porous surface morphology and crystal orientation in integrated circuit fabrication by modifying process steps in an integrated circuit process. In one aspect, the invention improves the surface morphology or smoothness by patterning the ferroelectric thin film prior to the final crystallization furnace anneal. Because the grain growth of the ferroelectric thin film mainly occurs during the final crystallization furnace anneal, patterning the ferroelectric thin film prior to this anneal decreases the shorting problems that occur during the patterning process with thin films having a large grain size. This eliminates the problems associated with patterning through thin films with large grain size. Preferably, the layered superlattice material is strontium bismuth tantalate, strontium bismuth tantalum niobate, or strontium bismuth niobate.

In another aspect, the invention further overcomes the problem of porous surface morphology and crystal orientation in the fabrication of layered superlattice material by incorporating a second rapid thermal anneal (RTA) after the patterning of preferably the top electrode, the ferroelectric thin film material and preferably the bottom electrode, but before the final crystallization furnace anneal. This second rapid thermal anneal successfully results in a significant decrease in the leakage current and an increase in the remnant polarization. It has been found that the second RTA after the patterning is particularly effective.

The invention further overcomes the problem of porous surface morphology and crystal orientation in integrated circuit fabrication by depositing a second layer of layered superlattice material over the first layered superlattice material thin film which is prepared by conventional methods. This second layer of layered superlattice material further reduces the surface roughness of first layered superlattice material thin films. It is preferably deposited by use of a sol-gel solution. In the preferred embodiment, first a single layer of layered superlattice material thin film is deposited by preferably KJC-MOD over the bottom electrode of a capacitor and then baked preferably in first and second bake steps. These steps are repeated until the designed thickness of the layered superlattice material thin film is achieved. Then an optional furnace anneal at 700° C. in oxygen is performed on the baked layered superlattice material thin film; then a second layer of layered superlattice material sol-gel solution is deposited on the substrate and baked, preferably in first and second bake steps, followed by a furnace anneal.

In a further aspect, the invention overcomes the problem of porous surface morphology and crystal orientation in integrated circuit fabrication by applying an exacting amount of ultraviolet (UV) radiation during the baking process. This UV photon energy created by the UV source during baking effectively decomposes the metalorganic compounds. Chemical bonds in metalorganic layered superlattice material solutions have various specified binding energies in accordance with each chemical bond. These binding energies are taken into consideration and the UV radiation source wavelength, UV radiation power density, and UV radiation exposure time are selected to fabricate a smoother layered superlattice material microstructure. Layered superlattice materials processed according to the invention showed no fatigue up to $10^{10}$ cycles of 3.0 volt bipolar stresses. By employing the modified UV radiation baking processes, the break down voltage (VBD) improved up to 12–13 volts and break down field (EBD) improved up to more than 1.1 MV/cm.

The invention provides a method of fabricating an integrated circuit wherein the method includes the steps of: providing a substrate, and a precursor containing metal moieties in effective amounts for spontaneously forming a layered superlattice material upon heating said precursor; applying the precursor to the substrate to form a coating; patterning the coating; and then treating the coated substrate to crystallize said thin film of layered superlattice material on the substrate; and completing the fabrication of the integrated circuit to include at least a portion of the layered superlattice material in an active component in the integrated circuit. Preferably, the step of applying the precursor to the substrate comprises applying two coats of precursor to the substrate. Preferably, the step of applying comprises a first baking step and a second baking step. Preferably, the first baking step comprises baking the substrate at a temperature not exceeding 300° C. for a time period not exceeding 60 minutes. Preferably, the first baking step is conducted in air. Preferably, the second baking step comprises baking the substrate at a temperature not exceeding 300° C. for a time period not exceeding 60 minutes. Preferably, the second baking step is conducted in air. Preferably, the temperature of the first bake is in the range of 150° C.–170° C. for a time period of 1 minute. Preferably, the temperature of the second bake is in the range of 250° C.–270° C. for a time period of 4 minutes.

Preferably, the step of treating the substrate comprises a rapid thermal anneal. Preferably, the rapid thermal anneal is conducted at a temperature not exceeding 800° C. for a time period not exceeding 600 seconds. Preferably, the rapid thermal anneal is conducted at a temperature of between 690° C. and 710° C. for a time period between 30 seconds and 300 seconds. Preferably, the rapid thermal anneal is conducted in oxygen. Preferably, the layered superlattice material includes an A-site element, a B-site element, a superlattice generator element, and an anion. Preferably, said A-site element comprises one or more elements from the group consisting of strontium, calcium, barium, bismuth, cadmium, and lead. Preferably, said B-site element comprises one of more elements from the group consisting of titanium, tantalum, hafnium, tungsten, niobium and zirconium. Preferably, said superlattice generator element comprises one or more elements from the group consisting of bismuth, scandium, yttrium, lanthanum, antimony, chromium, and thallium. Preferably, said anion comprises an element from the group consisting of oxygen, chlorine, fluorine, and hybrids thereof.

Preferably, the layered superlattice material comprises a solid solution of two or more of the layered superlattice materials. Preferably, the layered superlattice material comprises strontium bismuth tantalate. Preferably, the layered superlattice material contains metal atoms in molar proportion corresponding to a stoichiometric formula $Sr_aBi_b(Ta_{1-x}Nb_x)O_{[9+(a-1)+(b-2)(1.5)+(c-2)(2.5)]}$, where 0.8a1, 2b2.6, 0x0.3 and 1.9c2.3. Preferably, a=0.9, b=2.2, x=0 and c=2.0. Preferably, the step of treating the substrate further includes the step of depositing a top electrode on the layered superlattice material. Preferably, the top electrode comprises platinum. Preferably, the patterning step further includes patterning the top electrode before the treating step. Preferably, the substrate includes a bottom electrode and the patterning step further includes patterning the coating and the bottom electrode before the treating step.

Preferably, the treating step comprises a crystallizing furnace anneal. Preferably, the crystallizing furnace anneal is conducted at a temperature of from 690° C.–710° C. for a time period of from 40 to 80 minutes. Preferably, the crystallizing furnace anneal is conducted in oxygen.

In another aspect, the invention provides a method of fabricating an integrated circuit wherein the method includes the steps of: providing a substrate, a first precursor containing metal moieties in effective amounts for spontaneously forming a first thin film layered superlattice material upon heating the first precursor, and a second precursor containing metal moieties in effective amounts for spontaneously forming a second thin film layered superlattice material upon heating the second precursor, the first precursor being different than the second precursor; applying the first precursor to the substrate to form a first coating, and thereafter applying the second precursor to the substrate to form a second coating; treating the coatings on the substrate to form on the substrate the first thin film of layered superlattice material having a first thickness and the second thin film layered superlattice material having a second thickness, wherein the ratio of the second thickness to said first thickness ranges from 5% to 35%; and completing the fabrication of the integrated circuit to include at least a portion of the first and second thin film layered superlattice materials in the integrated circuit.

Preferably, the first precursor includes a compound selected from the group consisting of carboxylates and alkoxycarboxylates, and the second precursor includes an alkoxide. Preferably, the first precursor comprises a KCJ-MOD precursor and the second precursor comprises a TOK Sol-Gel precursor. Preferably, the first layered superlattice material and the second layered superlattice material comprise essentially the same layered superlattice material. Preferably, the ratio ranges from 10% to 30%. Preferably, the first layered superlattice material and the second layered superlattice material comprise strontium bismuth tantalate or strontium bismuth tantalum niobate. Preferably, the second layered superlattice material crystallizes at a lower temperature than the first layered superlattice material. Preferably, the second layered superlattice material has a higher dielectric constant than the first layered superlattice material. Preferably, the second layered superlattice material comprises bismuth tantalate. Preferably, the ratio ranges from 10% to 20%. Preferably, the ratio ranges from 10% to 30%. Preferably, the treating further comprises a first baking step and a second baking step. Preferably, the first baking step and the second baking step are conducted on the first thin film layered superlattice material prior to applying the second thin film layered superlattice material. Preferably, the first baking step and the second baking step are conducted on the second thin film layered superlattice material. Preferably, the first baking step comprises baking the substrate at a temperature not exceeding 300° C. for a time period not exceeding 60 minutes. Preferably, the temperature is 160° C. and the time period is 1 minute. Preferably, the second baking step comprises baking the substrate at a temperature not exceeding 300° C. for a time period not exceeding 60 minutes. Preferably, the temperature is 260° C. and the time period is 4 minutes.

Preferably, the step of treating the substrate further comprises a rapid thermal anneal. Preferably, the rapid thermal anneal is conducted at a temperature not exceeding 800° C. for a time period not exceeding 600 seconds. Preferably, the rapid thermal anneal is conducted at a temperature between 675° C.–700° C. for a time period of 30 seconds. Preferably, the first and second layered superlattice materials include an A-site element, a B-site element, a superlattice generator element, and an anion. Preferably, said A-site element comprises one or more elements from the group consisting of strontium, calcium, barium, bismuth, cadmium, and lead. Preferably, said B-site element comprises one of more elements from the group consisting of titanium, tantalum, hafnium, tungsten, niobium and zirconium. Preferably, said superlattice generator element comprises one or more elements from the group consisting of bismuth, scandium, yttrium, lanthanum, antimony, chromium, and thallium. Preferably, said anion comprises an element from the group consisting of oxygen, chlorine, fluorine, and hybrids thereof. Preferably, the first and second layered superlattice materials comprise a solid solution of two or more of the layered superlattice materials. Preferably, the first and second layered superlattice materials comprise strontium bismuth tantalate.

Preferably, the method further comprises forming an electrode after applying the second coating and patterning the electrode and the first and second coatings, and the treating further includes a crystallizing furnace anneal of the substrate after patterning of the electrode and the layered superlattice materials. Preferably, the treating includes a first crystallizing furnace anneal after the first precursor coating and prior to the second precursor coating and a second crystallizing furnace anneal after the second precursor coating.

In a further aspect, the invention provides for a method of fabricating an integrated circuit wherein the method includes the steps of: providing a substrate; a precursor containing metal moieties in effective amounts for spontaneously forming a layered superlattice material upon heating said precursor; applying the precursor to the substrate to form a coating; performing a first rapid thermal processing of the coating to form a solid thin film on the substrate; forming an electrode on the solid thin film; patterning the electrode and the solid thin film; performing a second rapid thermal processing of the patterned electrode and the solid film to form the layered superlattice material; and completing the fabrication of the integrated circuit to include at least a portion of the layered superlattice material in an active element of the integrated circuit. Preferably, the first and second rapid thermal anneals are conducted at a temperature not exceeding 800° C. for a time period not exceeding 600 seconds. Preferably, the first rapid thermal anneal is conducted at a temperature of between 675° C.–725° C. for a time period of 60 seconds or less. Preferably, the second rapid thermal anneal is conducted at a temperature of between 675° C.–725° C. for a time period of 300 seconds or less. Preferably, the first and second rapid thermal anneals are conducted at a temperature of 700° C. or less. Preferably, the first and second rapid thermal anneals are conducted in oxygen.

Preferably, the method further includes a crystallizing furnace anneal of the layered superlattice material after the second rapid thermal anneal. Preferably, the crystallizing furnace anneal is conducted at 700° C. for a period of 60 minutes. Preferably, the crystallizing furnace anneal is conducted in oxygen. Preferably, the method further comprises a first baking step and a second baking step prior to said first rapid thermal anneal. Preferably, the first baking step comprises baking at a temperature not exceeding 300° C. for a time period not exceeding 60 minutes. Preferably, the first baking step comprises baking at a temperature of 160° C. for a time period of 1 minute. Preferably, the second baking step comprises baking at a temperature not exceeding 300° C. for a time period not exceeding 60 minutes. Preferably, the second baking step comprises baking at a temperature of 260° C. for a time period of 4 minutes.

The invention also provides a method of fabricating an integrated circuit wherein the method includes the steps of: providing a substrate, a precursor containing metal moieties in effective amounts for spontaneously forming a layered superlattice material upon heating said precursor; applying the precursor to the substrate to form a coating and treating the coating, the treating comprising: performing a first bake at a temperature not exceeding 300° C. for a time period not exceeding 60 minutes on the coated substrate while subjecting the coated substrate to an ultraviolet radiation source power density of between 0.1 mW/cm$^2$ and 10 mW/cm$^2$ for a time period of between one to five minutes; performing a second bake at a temperature not exceeding 300° C. for a time period not exceeding 60 minutes on the coating; depositing a top electrode on the coated substrate; treating the coating and top electrode; and completing the fabrication of the integrated circuit to include at least a portion of the layered superlattice material in an active component in said integrated circuit.

Preferably, the coated substrate is subjected to an ultraviolet radiation source power density of between 0.1 mW/cm$^2$ and 10 mW/cm$^2$ for a time period of between one to five minutes during the second bake. Preferably, the ultraviolet radiation source power density is 1 mW/cm$^2$. Preferably, the ultraviolet radiation source wavelength is between 200 nm to 300 nm. Preferably, the ultraviolet radiation source wavelength is 260 nm. Preferably, the temperature is in the range of from 150° C. to 170° C. for a time period of 4 minutes. Preferably, the first bake and the second bake is conducted in air or nitrogen. Preferably, the step of treating the coated substrate comprises a rapid thermal anneal. Preferably, the rapid thermal anneal is conducted at a temperature of between 690° C. and 710° C. for a time period between 30 seconds and 300 seconds. Preferably, the rapid thermal anneal is conducted in oxygen. Preferably, the layered superlattice material comprises strontium bismuth tantalate.

In still a further aspect, the invention provides a method of fabricating an integrated circuit, the method characterized by the steps of: providing a substrate, a precursor containing metal moieties in effective amounts for spontaneously forming a layered superlattice material upon heating the precursor; applying the precursor to the substrate to form a coating; and treating the coating to form a solid film, the treating comprising: applying ultraviolet radiation of a wavelength between 200 nm and 300 nm to the coating or solid film for a time of between one minute and five minutes, and at a power density of between 0.1 mW/cm$^2$ and 10 mW/cm$^2$. Preferably, the wavelength is 260 nm. Preferably, the time is 4 minutes. Preferably, the power density is 1 mW/cm$^2$.

Other features, objects and advantages of the invention will become apparent from the following description when read in conjunction with the accompanying drawings.

DETAILED DESCRIPTION OF THE PREFERRED EMBODIMENT

1. Overview

Figure 1:
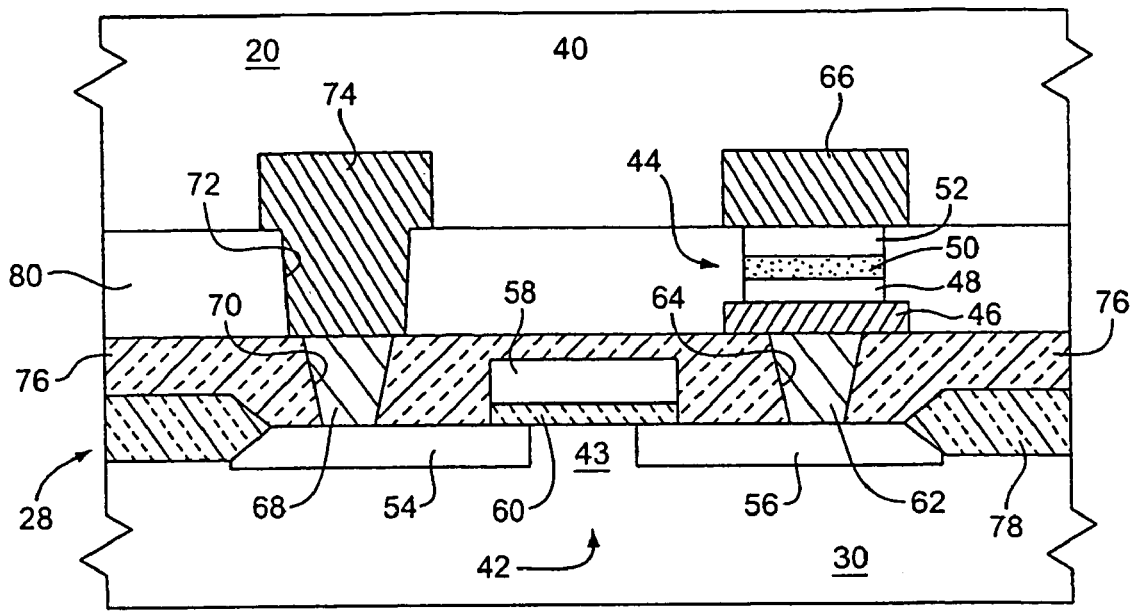
FIG. 1 depicts a cross-sectional view of an integrated circuit according to the present invention.

FIG. 1 depicts a cross-sectional view of an integrated circuit 40. Integrated circuit 40 includes transistor 42 and capacitor 44 formed on a wafer 28 including semiconductor substrate 30. Semiconductor substrate 30 may comprise silicon, gallium arsenide, silicon germanium, or other semiconductor, and may also include other substrate materials such as ruby, glass or magnesium oxide. In the preferred embodiment, semiconductor substrate 30 is silicon. A field oxide region 78 is formed on a surface of semiconductor substrate 30. Semiconductor substrate 30 comprises a highly doped source region 54 and a highly doped drain region 56, which are formed about a doped channel region 43. Doped source region 54, drain region 56 and channel region 43 are preferably n-type doped regions. A gate insulator 60 comprising a thin film of high dielectric constant insulator is located on semiconductor substrate 30, above channel region 43. Gate insulator 60 has a thickness in the range of from 1 nm to 50 nm, preferably from 5 nm to 20 nm. These source region 54, drain region 56, channel region 43, gate insulator 60 and gate electrode 58 together form a MOSFET 42.

A first interlayer dielectric (ILD) layer 76, preferably made of boron doped phospho-silicate glass (BPSG) is located on semiconductor substrate 30 and field oxide region 78. ILD 76 is patterned to form vias 70, 64 to source region 54 and drain region 56, respectively. Plugs 68, 62 are electrically conductive and typically comprise polycrystalline silicon or tungsten. An electronically conductive buffer/diffusion barrier layer 46 according to the invention is located on ILD 76 in electrical contact with plug 62. Diffusion barrier layer 46 is made of, for example, $IrO_2$ and typically has a thickness of from 1 nm to 30 nm, preferably from 1 nm to 5 nm.

As depicted in FIG. 1, a bottom electrode layer 48 is located on diffusion barrier layer 46. It is preferable that the bottom electrode contains a non-oxidized precious metal such as platinum, palladium, silver and gold. In addition to the precious metal, metal such as aluminum, aluminum alloy, aluminum silicon, aluminum nickel, nickel alloy, copper alloy, and aluminum copper may be used for electrodes of a dielectric or ferroelectric memory. In the preferred embodiment, first electrode 48 is made of platinum and has a thickness of 200 nm. Preferably, it also includes at least one adhesive layer (not shown), such as titanium, to enhance the adhesion of the electrodes to adjacent underlying or overlying layers of the circuits. Layered superlattice material layer 50, comprising a thin film of high dielectric constant insulator according to the invention, is located on bottom electrode layer 48. Layered superlattice material layer 50 has a thickness in the range of from 5 nm to 500 nm, preferably from 30 nm to 100 nm. A top electrode layer 52, made of platinum and having a thickness of 200 nm, is formed on layered superlattice material layer 50. First electrode layer 48, layered superlattice material layer 50 and top electrode layer 52 together form memory capacitor 44. Diffusion barrier layer 46 inhibits the diffusion of metal atoms and oxygen from layered superlattice material layer 50 and bottom electrode 48 into semiconductor substrate 30. A second interlayer dielectric layer (ILD) 80 made of nondoped silicate glass (NSG) is deposited to cover ILD 76, buffer/diffusion layer 46, and dielectric memory capacitor 44. A PSG film or a BPSG film could also be used in layer 80. ILD 76 and ILD 80 may also be made of the layered superlattice material according to the invention. ILD 80 is patterned to form via 72 to plug 68. A metalized wiring film is deposited to cover ILD 80 and fill via 72 and then patterned to form source electrode wiring 74 and top electrode wiring 66. Wirings 74, 66 preferably comprise Al—Si—Cu standard interconnect metal with a thickness of about 200 nm to 300 nm.

It should be understood that the term "substrate" is often used ambiguously in the art of integrated circuits. Often it is used to refer to the silicon, gallium arsenide or other wafer, such as 30 of FIG. 1, on which the integrated circuit is fabricated. Sometimes the term is used to refer to the incomplete portion of the integrated circuit on which a particular layer is formed. For example, in this sense, the "substrate" on which capacitor 44 in FIG. 1 is formed is in general terms the incomplete capacitor through layer 76. At other times the word "substrate" is used to mean the immediate layer on which a material is formed. In this sense, layer 76 is the immediate substrate on which capacitor 44 is formed. In this specification, the term "substrate" is used broadly to mean any layer on which another layer is formed. In particular, when a capacitor, such as 44 in FIG. 1, is being discussed, the "substrate" most immediately is layer 76 and more generally layer 76 and the layers below it. When an active layer, such as the layered superlattice material layer 50 in FIG. 1, is being discussed, then the "substrate" is most generally first electrode 48 and all the layers of the incomplete integrated circuit below it.

Figure 2:
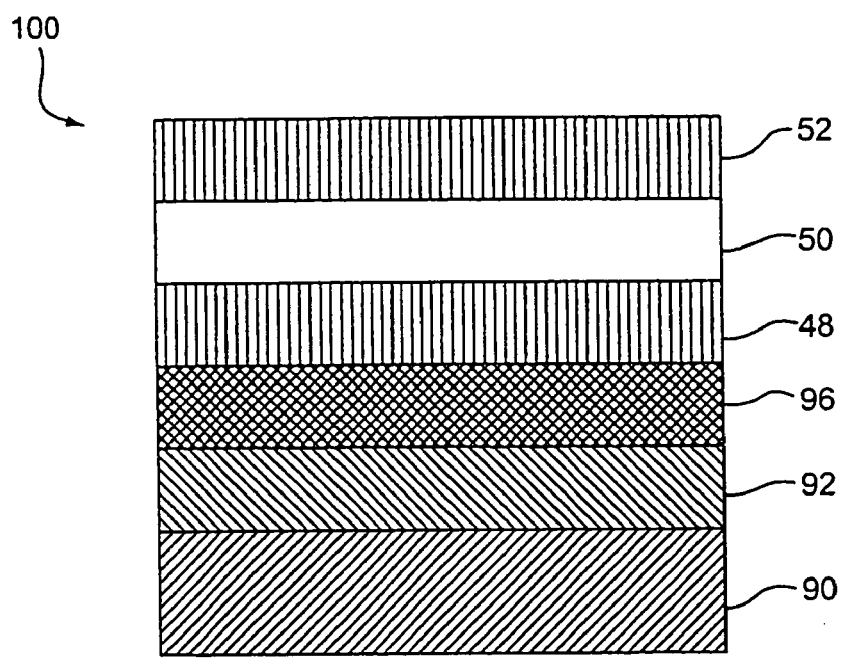
FIG. 2 depicts a cross-sectional view of an embodiment of the invention.

FIG. 2 depicts a cross-sectional view of an integrated circuit capacitor 100 containing a layered superlattice material layer 50 in accordance to an embodiment of the invention. Integrated circuit capacitor 100 is preferably formed on a wafer 90 that may be silicon, gallium arsenide, ruby or other semiconductor, or an insulator, such as glass or magnesium oxide (MgO). In the preferred embodiments described herein, it is a P-type silicon wafer of about 15–20 centimeters in diameter. Preferably, it is a single crystal. Layer 92 of about 500 nm of silicon dioxide is grown on silicon wafer 90 by conventional methods, then an adhesion layer 96 of titanium is deposited above silicon dioxide layer 92. Adhesion layer 96 of titanium functions as an adhesion metal to prevent peeling of the platinum component away from the oxide layer. Tantalum, iridium and iridium oxide are also useful as adhesion metals. The titanium or other adhesion metal is typically sputtered to a thickness ranging from 10 nm to 20 nm, then first electrode 48 is formed by sputtering from 100 nm to 200 nm of platinum above adhesion layer 96. The incomplete device is then annealed in an oxygen furnace, preferably for 30 minutes at 650° C. The annealing in oxygen serves, among other things, to stabilize the titanium in titanium layer 96. Both layers 96 and 48 are preferably formed by conventional atomic sputtering techniques, such as DC magnetron sputtering or radio frequency sputtering.

A layered superlattice material layer 50 is formed of a material that is preferably having dielectric and/or ferroelectric properties. Layered superlattice material layer 50 is fabricated as described in detail below and is preferably less than about 400 nm thick, and most preferably about 200 nm thick. Layer 50 may be a perovskite, such as barium strontium titanate or strontium titanate. Layer 50 is more preferably a layered superlattice material, and is most preferably strontium bismuth tantalate.

All types of layered superlattice materials may be generally summarized under the average empirical formula:

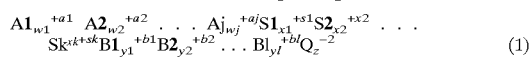
(1)

Note that Formula (1) refers to a stoichiometrically balanced list of superlattice-forming moieties. Formula (1) does not represent a unit cell construction, nor does it attempt to allocate ingredients to the respective layers. In Formula (1), A1, A2 . . . Aj preferably represent A-site elements in a perovskite-like octahedral structure, which includes elements such as strontium, calcium, barium, bismuth, lead, and mixtures thereof, as well as other metals of similar ionic radius. S1, S2 . . . Sk represent superlattice generator elements, which preferably include only bismuth, but can also include trivalent materials such as yttrium, scandium, lanthanum, antimony, chromium, and thallium. B1, B2 . . . Bl preferably represent B-site elements in the perovskite-like structure, which may be elements such as titanium, tantalum, hafnium, tungsten, niobium, vanadium, zirconium, and other elements. Q represents an anion, which preferably is oxygen but may also be other elements, such as fluorine, chlorine and hybrids of these elements, such as the oxyfluorides, the oxychlorides, etc. The superscripts in Formula (1) indicate the valences of the respective elements. The subscripts indicate the number of atoms of a particular element in the empirical formula compound. In terms of the unit cell, the subscripts indicate a number of atoms of the element, on the average, in the unit cell. The subscripts can be integer or fractional. That is, Formula (1) includes the cases where the unit cell may vary throughout the material, e.g. in $Sr_{0.75}Ba_{0.25}Bi_2Ta_2O_9$, on the average, 75% of the time Sr is the A-site atom, and 25% of the time Ba is the A-site atom. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one or two B-site elements, although Formula (1) is written in the more general form because the invention is intended to include the cases where either of the A- and B-sites and the superlattice generator can have multiple elements. The value of z is found from the equation:

$$(a1w1+a2w2 \ldots +ajwj)+(s1x1+s2x2 \ldots +skxk)+ (b1y1+b2y2 \ldots +bjyj)=2z \quad (2)$$

The layered superlattice materials do not include every material that can be fit into the Formula (1), but only those ingredients which spontaneously form themselves into a layer of distinct crystalline layers during crystallization. This spontaneous crystallization is typically assisted by thermally treating or annealing the mixture of ingredients. The enhanced temperature facilitates ordering of the superlattice-forming moieties into thermodynamically favored structures, such as perovskite-like octahedra.

The term "layered superlattice material" herein also includes doped layered superlattice materials. That is, any of the material included in Formula (1) may be doped with a variety of materials, such as silicon, germanium, uranium, zirconium, tin, chromium, dysprosium, or hafnium.

Formula (1) at least includes all three of the Smolenskii-type ferroelectric layered superlattice materials, namely, those having the respective empirical formulae:

(3)

(4) and

(5)

wherein A is an A-site metal in the perovskite-like superlattice; B is a B-site metal in the perovskite-like superlattice; S is a trivalent superlattice-generator metal such as bismuth or thallium; and m is a number sufficient to balance the overall formula charge. Where m is a fractional number, the overall average empirical formula provides for a plurality of different or mixed perovskite-like layers. Formula (5) is most preferred. Layered superlattice materials are described in more detail in U.S. Pat. No. 5,519,234, issued May 21, 1996 to Carlos A. Paz de Araujo et al., which is hereby incorporated by reference as though fully disclosed herein. Mixed layered superlattice materials, which are also included in the general term "layered superlattice materials", are described in detail in U.S. Pat. No. 5,955,754 issued Sep. 21, 1999 to Azuma et al., which is also incorporated by reference herein.

Figure 3:
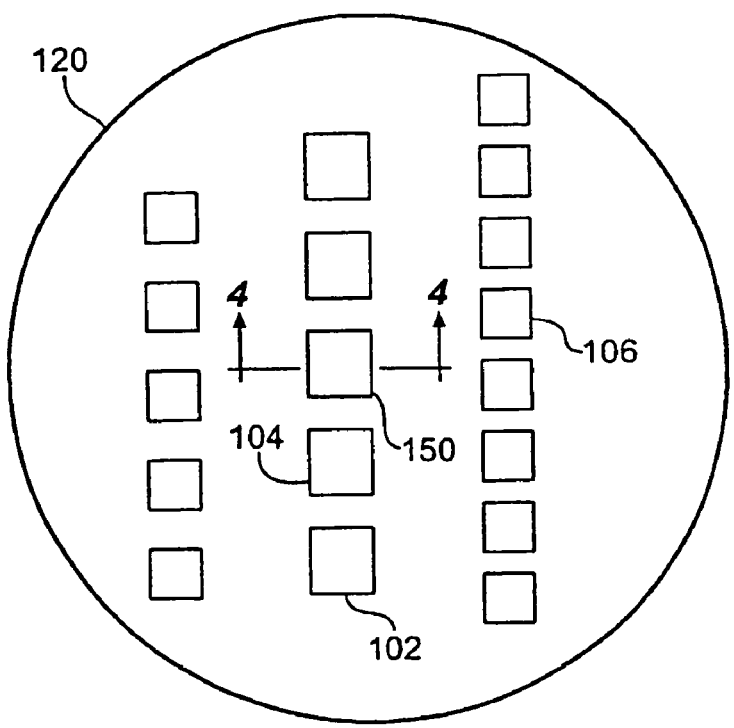
FIG. 3 depicts a top view of a wafer on which thin film capacitors fabricated by the process according to the invention are shown greatly enlarged.
Figure 4:
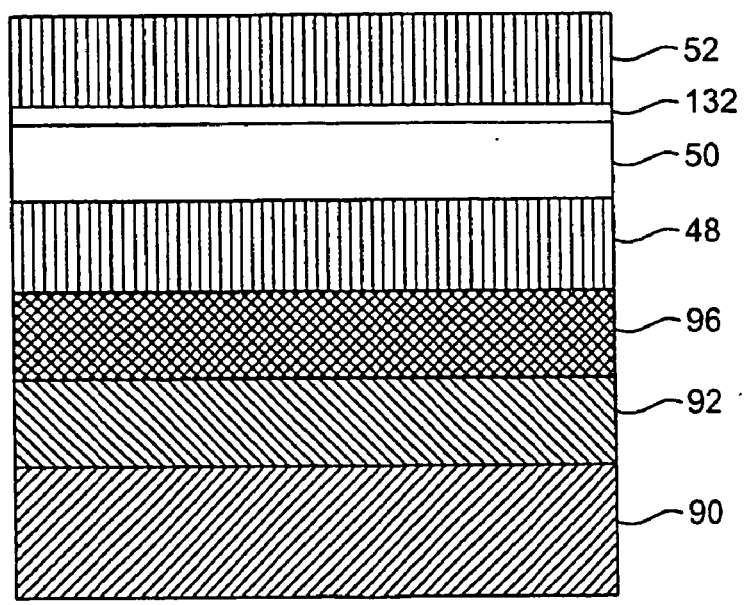
FIG. 4 depicts a cross-sectional view of a capacitor on FIG. 3 through the line 4—4.

Directing attention to FIG. 3, a wafer 120 containing numerous capacitors 102, 106, 150, etc., is shown. FIG. 3 is a top view of wafer 120 on which the thin film capacitors 102, 106, 150, etc., fabricated by the process according to the invention are shown greatly enlarged. FIG. 4 is a portion of a cross section of FIG. 3 taken through lines 4—4 bisecting capacitor 150. Referring to FIG. 4, an alternative embodiment of the invention is shown which depicts the second layer 132 deposited on top of the first layered superlattice material layer 50. In this embodiment, all structures up to second layer 132 are the same as in the embodiment described with reference to FIG. 2, and thus the numerals referring to those structures have not been changed. As is described in the embodiment of FIG. 2, this integrated circuit capacitor 150 is preferably formed on wafer 90. Layer 92 or silicon dioxide is grown on silicon wafer 90 by conventional methods, then an adhesion layer 96 of titanium functions as an adhesion metal to prevent peeling of the platinum component away from the oxide layer, then first electrode 48 is formed by sputtering from 100 nm to 200 nm of platinum above adhesion layer 96. The incomplete device is then annealed in an oxygen furnace, preferably for 30 minutes at 650° C. Both layers 96 and 48 are preferably formed by conventional atomic sputtering techniques, such as DC magnetron sputtering or radio frequency sputtering, then a first thin film layered superlattice material layer 50 of a material that is preferably a layered superlattice material having dielectric and/or ferroelectric properties is formed on the substrate. The first layered superlattice material layer 50 is coated on the substrate by a KJC-MOD process. A MOD process includes a carboxylate or an alkoxycarboxylate as a precursor, and may also include an alkoxide. Typically, in a MOD process a first metal, an alcohol, and a carboxylic acid are reacted to form a metal alkoxycarboxylate which is then reacted with an alkoxide and/or a carboxylate of a second metal to for the precursor. A MOD process as described above is described in U.S. Pat. No. 5,514,822, issued May 7, 1996 to McMillan et al., and is hereby incorporated by reference herein. A KJC-MOD process uses a commercially available MOD precursor made by Kojundo Corporation in Japan and is available in the United States, or its equivalent.

Layer 50 may be a perovskite, such as barium strontium titanate or strontium titanate. Layer 50 is more preferably a layered superlattice material, and is most preferably strontium bismuth tantalate. Layer 50 is then baked in air or dry nitrogen, and preferably at a temperature of from about 120° C. to 500° C. for a period of time sufficient to remove substantially all of the organic materials from the liquid thin film and produce a solid layered superlattice material thin film 50. A subsequent step of baking at a higher temperature is then performed. Layer 50 is then exposed to a rapid thermal anneal at a temperature of from 675° C. to 700° C. for a preferred maximum time of about 40 seconds. If the resultant dried thin film is not of the desired thickness, then the deposition, baking and rapid thermal annealing steps can be repeated until the desired thickness is obtained.

A second layered superlattice material layer 132 then is deposited on top of the first superlattice material layer 50 by a TOK Sol-Gel process. A Sol-Gel process always includes only alkoxide precursors. A TOK Sol-Gel process utilizes a commercially available alkoxide precursor made by Tokyo Oka in Japan and available in the United States, or its equivalent. Layer 132 is baked and annealed as described below and then a second electrode 52, preferably formed of platinum having a thickness of from about 1000 Å to 2000 Å, is formed atop layer 132, again by conventional atomic sputtering techniques.

2. Detailed Description of the Fabrication Process

Figure 5:
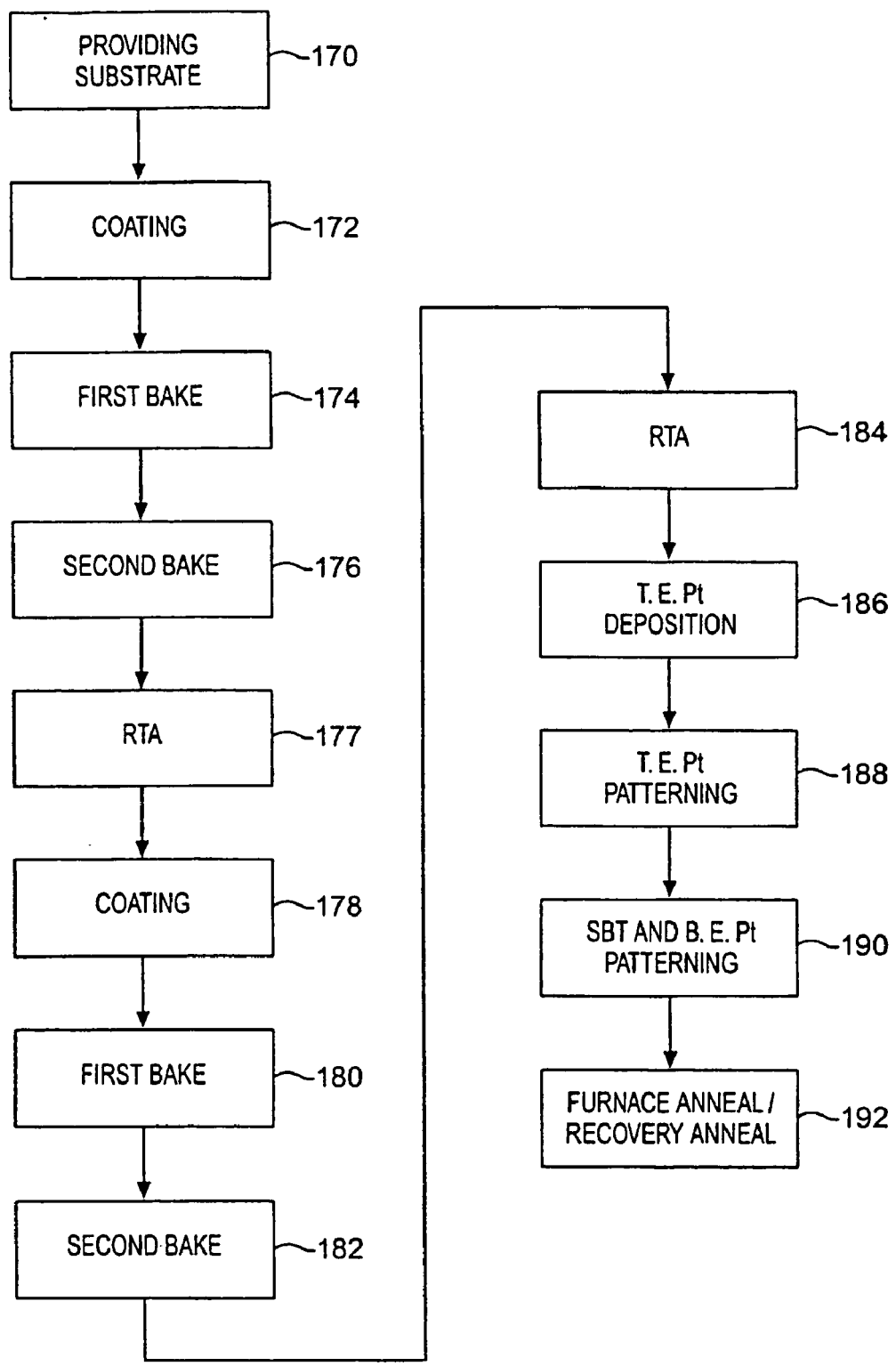
FIG. 5 depicts a process schematic diagram for fabricating the integrated circuit of FIG. 1.

FIG. 5 depicts a process schematic diagram for use in manufacturing integrated circuits such as in FIG. 2. The contents of the precursor solution should reflect relative molar proportions of polyoxyalkylated metals in amounts equivalent to the stoichiometric crystalline formula, after accounting for evaporation and sublimation losses in the manufacturing process. Step 170 preferably includes providing a substrate including wafer 90, $SiO_2$ layer 92, titanium adhesion layer 96, and first electrode 48. These components are not critical to the invention, and those skilled in the art will understand that step 170 more generally includes preparing any substrate to a point where layered superlattice material layer 50 may be applied. Layers 92, 96, as well as electrode 48, are applied by conventional techniques such as thermal oxidation for the $SiO_2$ and sputtering for the metal layers. Preferably, layer 96 is thermally oxidized in a furnace at 650° C. for a time period of 30 minutes in ambient oxygen. Preferably, the first electrode is deposited on top of oxidized layer 96 by DC sputtering to a thickness of 200 nm. Step 170 most preferably also includes prebaking the metalized substrate including electrode 48 at a temperature that is greater than or equal to the temperature of any of the subsequent process steps to be performed on the substrate as described below. This optional portion of step 170 includes prebaking the substrate in an oxygen atmosphere, preferably in a diffusion furnace at a temperature of from about 500° C. to 1000° C. prior to coating step 172. This prebaking step removes water and organic impurities from the substrate surface. More importantly, the prebaking decreases the internal stress of platinum layer 48 through the annealing effect of the prebaking and the partial oxidation and interdiffusion of the adhesion layer 96 metal. This interaction between layers 92, 96 and 48 minimizes a potential problem of the peeling of layers 96 and 48. Further, if adhesion layer 96 is a transition metal, the partial oxidation stabilizes the metal chemically. Therefore, the number of mobile atoms penetrating into thin film layered superlattice material layer 50 through platinum layer 48 is decreased, and thin film layered superlattice material layer 50 crystallizes more smoothly, i.e., without defects due to the diffused ions. If the substrate is not metallized, then the silicon or other wafer is preferably dehydrated at a lower temperature. Step 172 includes preparing a liquid precursor solution that is capable of forming a layered superlattice material layer 50 as ferroelectric material. The liquid precursor solution includes various polyoxyalkylated metal portions in an organic solvent. The liquid precursor solution is described more fully in the description of FIG. 2. Further, the reaction products are diluted to a molarity that will yield from 0.01 to 0.5 moles of the desired layered superlattice material compound per liter of solution. Most preferably, the reaction products concentration is 0.10 molar. The layered superlattice material of step 172 is applied to the substrate of step 170 by way of a KJC-MOD process. It is preferred to apply the solution by spinning the substrate from about 1000 RPM to about 3000 RPM, most preferably at 2500 RPM, while flowing the precursor onto the substrate at room temperature for about 20 to 60 seconds, most preferably for 30 seconds. However, these parameters may vary depending upon the precursor viscosity and the desired thickness of the film. This KJC-MOD technique serves to coat a surface of the substrate with a uniform, liquid thin film of precursor solution.

Step 174 includes drying the liquid precursor film that results from step 172. The liquid thin film of precursor solution is dried by baking it in air at a temperature of from about 150° C. to about 500° C., most preferably 160° C., for a period of time, e.g., 30 seconds to 30 minutes, most preferably 1 minute. The time required must be sufficient to remove substantially all of the volatile organic components of the precursor compound; however, some carbon residue may be expected due to the calcining of remaining organic substituents during the baking and/or subsequent annealing process steps. A multiple step drying process is useful to prevent cracking and bubbling of the thin film which can occur due to excessive volume shrinkage corresponding to an excessively rapid temperature rise. In step 176, a second baking process is utilized, whereby the thin film is dried by baking it in air at a temperature of from about 250° C. to about 500° C., most preferably 260° C., for a period of time, e.g., 30 seconds to 30 minutes, most preferably 4 minutes. The drying steps 172 and 174 are done in air or in nitrogen, preferably at low humidity of about 40% or less. Step 177 is a rapid thermal anneal of the dried layered superlattice material. For example, in this case of strontium bismuth tantalate, a rapid thermal anneal at a 100° C./second ramp rate and a maximum temperature of 725° C. for 30 seconds can be performed after the two drying stages of steps 174 and 176, and 180 and 182. Most preferably, the temperature of the rapid thermal anneal is between 675° C. and 700° C. for 30 seconds in an oxygen atmosphere. Radiation from a halogen lamp, infrared lamp, or an ultraviolet lamp provides the source of heat for the rapid thermal anneal bake step. Rapid thermal anneal step 177 is preferably performed in an oxygen atmosphere of between 20% and 100% oxygen, at a temperature of between 500° C. and 850° C., with a ramping rate of between 1° C./sec. and 200° C./sec., with a holding time of 5 seconds to 300 seconds. Substantially, all of the residual organics are burned out and/or vaporized during the rapid thermal anneal process; however, a small quantity of residual carbon may be detected due to calcining of the bound organic fractions. At the same time, the rapid temperature rise of the rapid thermal anneal promotes nucleation, i.e., the generation of numerous small crystalline grains of layers 50. These grains act as nuclei upon which further crystallization can occur. The presence of oxygen in the bake process is essential in forming these grains. Steps 172, 174, 176, and 177 are repeated until the desired thickness of the layered superlattice material is obtained. Step 178 proceeds under the same process conditions as mentioned above in step 172. Step 180 proceeds under the same process conditions as step 174, and step 182 proceeds under the same process conditions as step 176, as mentioned above. Further, the drying steps of 180 and 182 are followed by a rapid thermal anneal step 184. The process conditions for step 184 are the same as for step 177.

Step 186 includes sputtering second electrode 52 by any conventional technique, such as DC magnetron sputtering or radio frequency sputtering. Step 188 includes a conventional patterning of the device to form discrete circuit components of the integrated circuit as needed. More specifically, as will be understood by those skilled in the art, step 188 will preferably include the application of either a positive or negative photo resist, followed by reactive ion etching to pattern the device, and solvent mediated dissolution of the remaining photo resist. Step 190 includes the patterning of layered superlattice material 50 and first electrode 48. A novel embodiment of this invention is that the final crystallization anneal/recover anneal step 192 is performed after patterning steps 188 and 190. In the prior art, final crystallization anneals were performed prior to the patterning steps. In the prior art, the final crystallization anneal promoted grain growth and thereby increased porosity and roughness and therefore increased the difficulty of patterning an integrated circuit without incurring shorting problems within the integrated circuit.

In step 192, a final crystallizing anneal and recovery anneal is performed on the patterned integrated circuit for purposes of forming crystalline grains in the dried layer of layered superlattice material 50 that results from steps 174, 176, and 180, 182. The final crystallizing anneal is typically conducted at a temperature ranging from about 500° C. to about 1100° C. for a time that typically ranges from 30 minutes to 2 hours. The first anneal is preferably conducted in oxygen at a temperature ranging from about 700° C. to about 850° C. for 80 minutes. Most preferably, the final crystallization anneal is conducted at a temperature of 700° C. for 30 minutes in oxygen. A recovery anneal is then performed at 700° C. for a time period of 30 minutes in oxygen.

Terms of orientation herein, such as "upward," "downward," "above," "top," "upper," "below," "bottom," and "lower," mean relative to semiconductor substrate 30. That is, if a second element is "above" a first element, it means it is farther from the substrate, and if it is "below" another element then it is closer to semiconductor substrate 30 than the other element. A material gradient that is negative in the upward direction means that the lateral region or regions farther from semiconductor substrate 30 have less of the material. Terms such as "above" and "below" do not, by themselves, signify direct contact of one layer with an underlying layer.

The long dimension of semiconductor substrate 30 defines a plane that is considered to be a "horizontal" plane herein, and directions perpendicular to this plane are considered to be "vertical." The terms "lateral" or "laterally" refer to the direction of the flat plane of the thin film, that is, parallel to the horizontal direction.

Figure 6:
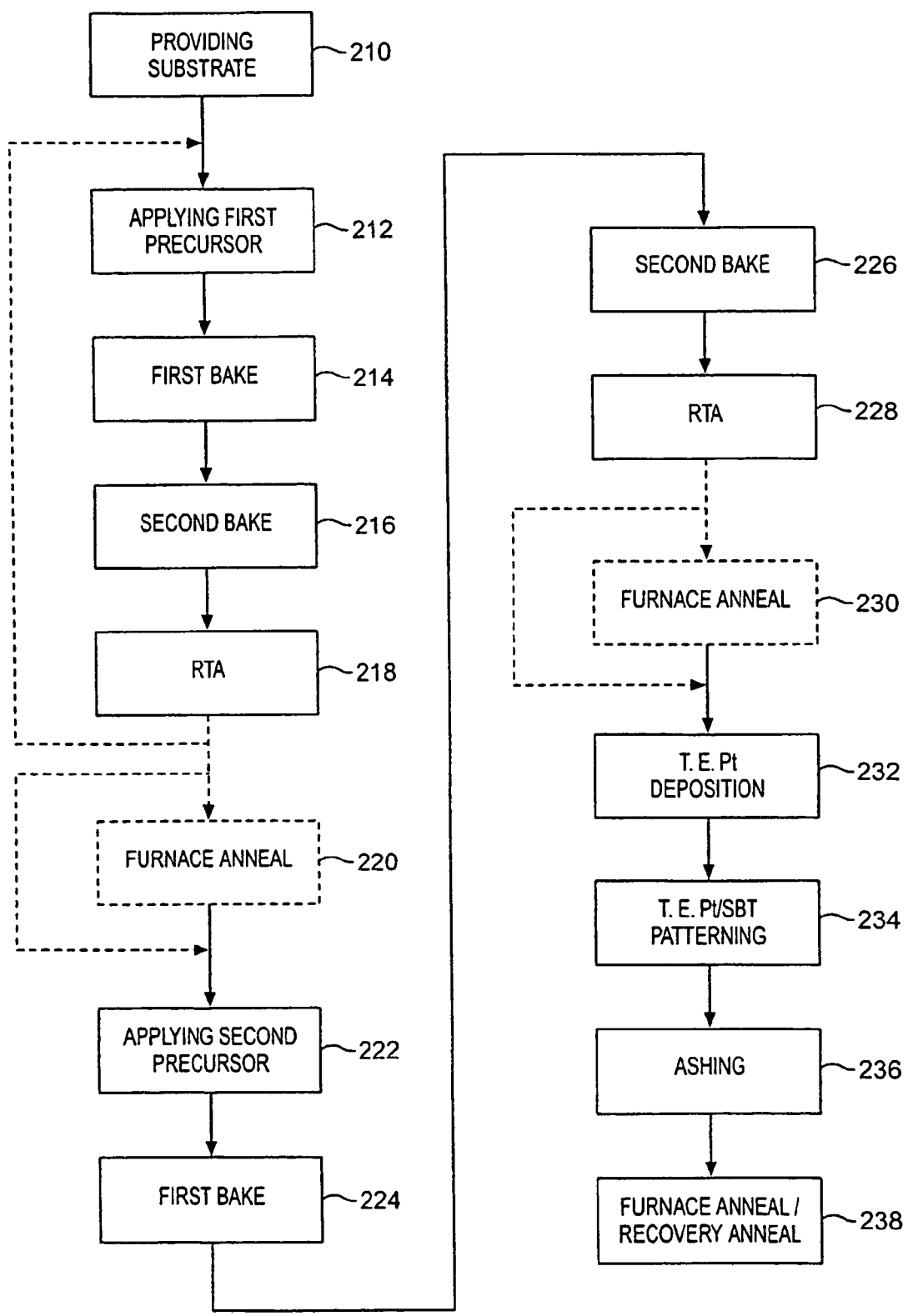
FIG. 6 depicts a process schematic diagram for fabricating the integrated circuit of FIG. 4.

FIG. 6 depicts another process schematic diagram for use in manufacturing integrated circuits according to another embodiment of the present invention. In step 210, the substrate is provided as described with reference to step 170 of FIG. 5. In step 212, the first precursor is applied as described with reference to step 172 of FIG. 5. In step 214, layered superlattice material layer 50 is baked as described with reference to step 174 of FIG. 5. In step 216, layered superlattice material layer 50 is baked again as described with reference to step 176 of FIG. 5. In step 218, a rapid thermal anneal is conducted on layered superlattice material layer 50 as described in step 177 of FIG. 5. After step 218, the process steps 212, 214, 216 and 218 are repeated two more times. In optional step 220, a furnace anneal is performed on the substrate for purposes of forming crystalline grains in the dried layer of layered superlattice material 50. Optional step 220 is annealed as described with reference to step 192 of FIG. 5. More preferably, the furnace anneal is conducted at 700° C. for a time period of 60 minutes in an oxygen atmosphere. Step 222 involves a novel embodiment of the present invention in that an ultra-thin second layer of strontium bismuth tantalate 132 is deposited on top of layered superlattice material 50 by a TOK Sol-Gel process. In step 224, the substrate with second layer 132 is baked as described with reference to step 174 of FIG. 5. In step 226, the substrate with second layer 132 is baked a second time as described with reference to step 176 of FIG. 5. In step 228, a rapid thermal anneal is performed on the substrate as described with reference to step 177 of FIG. 5.

Step 230 is an optional furnace anneal that can be performed on the substrate as described with reference to step 192 of FIG. 5. In step 232, a second electrode 52 is deposited on the substrate as described with reference to step 186 of FIG. 5. In step 234, a patterning process is performed on second electrode 52 and layered superlattice material layers 50, 132 as described with reference to steps 188 and 190 of FIG. 5. More specifically, as will be understood by those skilled in the art, step 234 will preferably include application of photo resist onto second electrode 52, then top electrode 52 and layered superlattice material layers 50, 132 are patterned using an ion milling process. In step 236, a photo resist ashing process is performed on the substrate to remove the photo resist coating. In step 238, a recovery anneal is conducted on the substrate at a temperature of 700° C. for a time period of 30 minutes in oxygen as described with reference to step 192 of FIG. 5.

Figure 7:
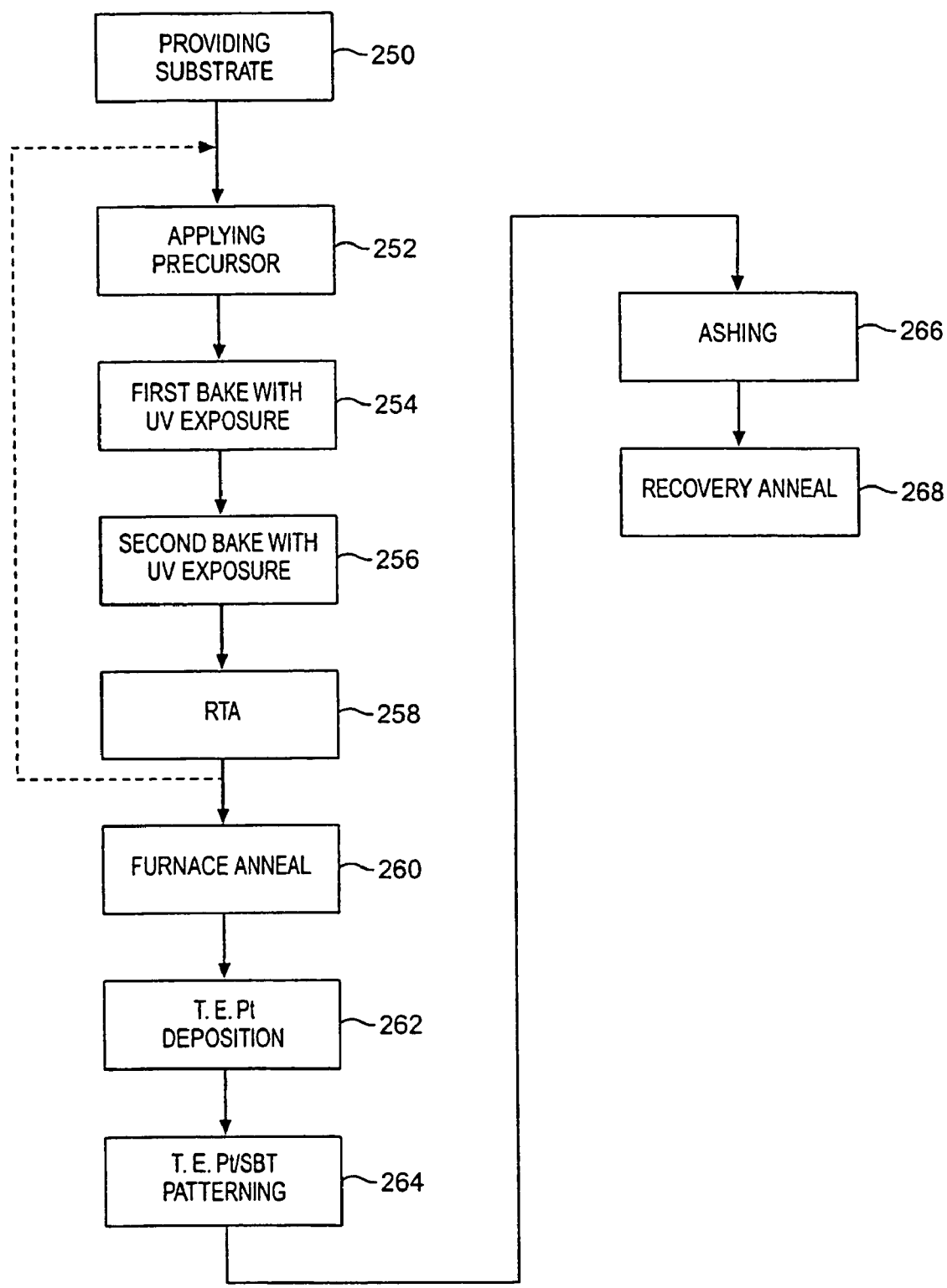
FIG. 7 depicts a process schematic diagram for fabricating an integrated circuit according to the UV baking aspect of the invention.

FIG. 7 depicts another process schematic diagram for use in manufacturing integrated circuits according to another embodiment of the present invention. In step 250, the substrate is provided as described with reference to step 170 of FIG. 5. In step 252, the precursor is applied to the substrate as described with reference to step 172 of FIG. 5. Step 254 involves a novel embodiment of the present invention in that layered superlattice material layer 50 is baked in the presence of ultraviolet radiation. More specifically, layered superlattice material layer 50 comprising strontium bismuth tantalate is baked in the presence of ultraviolet (UV) radiation sufficient to assist the baking process in breaking the metalorganic bonds or the other organic compounds of the precursor solution. Chemical bonds in the metalorganic strontium bismuth tantalate precursor solution have various specified binding energies in accordance with each chemical bond. Therefore, after these binding energies are thoroughly taken into consideration, employed UV radiation has to be carefully chosen. The parameters involved in choosing the most effective UV radiation to apply to the strontium bismuth tantalate layered superlattice material layer 50 are UV wavelength, UV power density, and UV exposure time and process sequence. These parameters are optimized during the baking process of the strontium bismuth tantalate layered superlattice material layer 50 to produce a smooth morphology without sacrificing the remnant polarization of layered superlattice material layer 50 performance. This optimization and balancing of the UV parameters versus the expense of providing each parameter creates a UV budget.

In step 254, a first bake is performed on the substrate as described with reference to step 174 of FIG. 5. More specifically, during baking step 174, a UV radiation source is applied to the substrate. The UV radiation source has a UV wavelength of between 200 nm to 300 nm, UV exposure for a time period from 1 minute to 5 minutes, and power density from 0.1 mW/cm$^2$ to 10 mW/cm$^2$. Most preferably, the UV radiation source has a UV wavelength of 260 nm, UV exposure time period of 4 minutes, and UV power density of 1 mW/cm$^2$.

In step 256, a second bake is performed on the substrate as described with reference to step 176 of FIG. 5. More specifically, during baking step 256, a UV radiation source is applied to the substrate. Preferably, the UV radiation source is as described with reference to step 254 of FIG. 7. In step 258, a rapid thermal anneal process is performed on the substrate as described with reference to step 177 of FIG. 5. The process steps 252, 254, 256, and 258 can be repeated one or more times until the desired thickness of layered superlattice material layer 50 is obtained. In step 260, a furnace anneal is performed on the substrate as described with reference to step 192 of FIG. 5. In step 262, a second electrode 52 is deposited on top of layered superlattice material layer 50 as described with reference to step 186 of FIG. 5. In step 264, second electrode 52 is patterned as described with reference to step 234 of FIG. 6. In step 266, an ashing process is performed on the substrate as described with reference to step 236 of FIG. 6. In step 268, a recovery anneal is performed on the substrate as described with reference to step 192 of FIG. 5.

Figure 8:
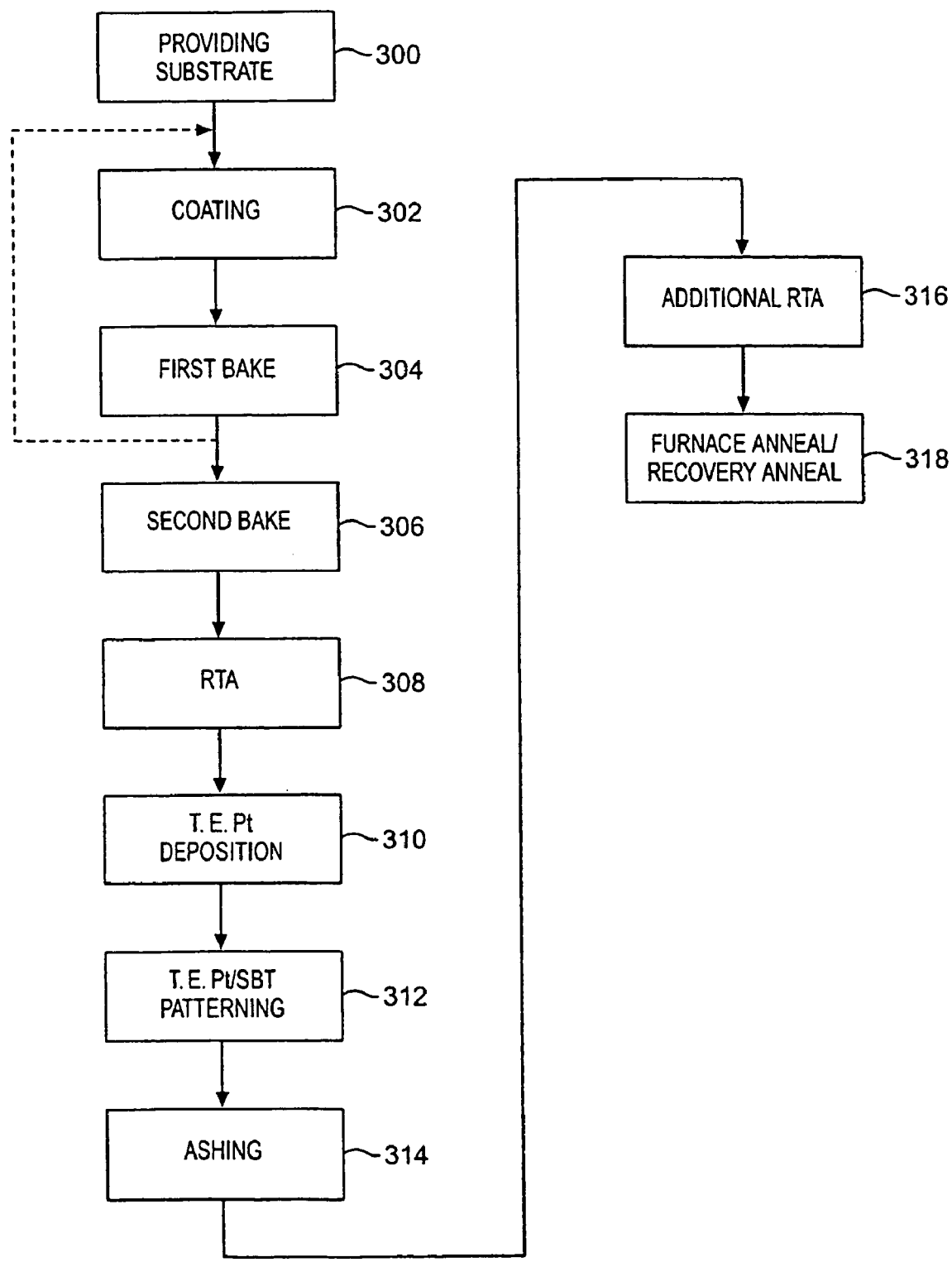
FIG. 8 depicts a process schematic diagram for fabricating an integrated circuit according to the second rapid thermal anneal aspect of the invention.

FIG. 8 depicts another process schematic diagram for use in manufacturing integrated circuits according to another embodiment of the present invention. In step 300, the substrate is provided as described with reference to step 170 of FIG. 5. In step 302, the precursor is applied to the substrate as described with reference to step 172 of FIG. 5. In step 304, layered superlattice material layer 50 is baked as described with reference to step 174 of FIG. 5. Process steps 302, 304 are repeated until a desired thickness of layered superlattice material layer 50 is obtained. In step 306, the substrate is baked again as described with reference to step 176 of FIG. 5. In step 306, a rapid thermal anneal is performed on the substrate as described with reference to step 177 of FIG. 5. In step 310, second electrode 52 is deposited on the substrate as described with reference to step 186 of FIG. 5. In step 312, a patterning process is performed on second electrode 52 and layered superlattice material layer 50 as described with reference to step 188 of FIG. 5. In step 314, a photo resist ashing process is performed on the substrate to remove the photo resist coating. Step 316 involves a novel embodiment of the present invention in that a second rapid thermal anneal process is performed on the substrate after steps 312, 314. Preferably, rapid thermal anneal step 314 is conducted at a temperature of 700° C., for a time period from 30 seconds to 300 seconds in an oxygen atmosphere. In step 318, a furnace anneal is performed on the substrate as described with reference to step 192 of FIG. 5.

3. Examples of the Fabrication Process and Property Dependence

Below, examples of the fabrication process according to the invention as applied to a wafer 28 as shown in FIG. 1 are given. Following each of the examples, there is a discussion of the electrical/electronic properties illustrated in the figures. The figures include hysteresis curves, such as FIGS. 8, 13, 14, 15, and 16. The figures also include graphs that plot the remnant polarization (2Pr) versus the voltage applied to the integrated circuit, such as FIGS. 9 and 17. In addition, the figures include a graph that plots the leakage current versus the applied voltage, such as FIG. 10. Further, the figures include a graph that plots the remnant polarization (2Pr) versus the second rapid thermal time (RTA), such as FIG. 11. Finally, the figures include a graph that plot the leakage current versus the second RTA, such as FIG. 12. The hysteresis curves are given in terms of either the applied voltage, in volts, versus the polarization charge in microcoulombs per centimeter squared. Generally, the hysteresis is shown for ten different voltages, ±1 volt, ±2 volts, ±3 volts, ±4 volts, and ±5 volts. As is well-known, hysteresis curves which suggest good ferroelectric properties tend to be relatively boxy and long in the direction of polarization, rather than thin and linear. The hysteresis measurements were all made on an uncompensated Sawyer-Tower circuit unless otherwise noted. The polarization charge 2Pr is the charge created by switching a capacitor such as 44 from a state where it is fully polarized in one direction, say the upward vertical direction, to the fully opposite fully polarized state, which would be a downward vertical direction. Here, "fully polarized" means the state in which the ferroelectric material has been polarized fully and the field removed. In terms of an hysteresis curve, such as shown in FIG. 8, it is the difference between Pr+, the point where the hysteresis curve crosses the positive polarization axis (y-axis), and Pr−, the point where the hysteresis curve crosses the negative polarization axis (y-axis). Unless otherwise noted, the 2Pr value is taken from the hysteresis measurement at the highest voltage. The higher the value of the 2Pr, the better the performance will be of the material in ferroelectric memories and other applications. A cycle is defined as the capacitor, such as 44, being switched through one square pulse. This polarization, 2Pr, is approximately twice the remnant polarization, Pr. Other parameters and terms used in the figures and discussion should be clear from the context.

EXAMPLE 1

Second Rapid Thermal Anneal After Patterning

A substrate 28 including capacitor 44 was fabricated in which layered superlattice material layer 50 was layered superlattice material, more specifically, strontium bismuth tantalate ($Sr_{0.9}Bi_{2.2}Ta_2O_9$). The precursor solution molarity was approximately 0.10 moles per liter. A substrate 28 comprising a single crystal silicon layer 90, a 5000 Å thick layer 92 of silicon dioxide, a 200 Å thick layer 96 of titanium, and a 2000 Å thick layer 48 of platinum was prebaked at 800° C. in a diffusion furnace for 30 minutes with an oxygen flow of 6 liters/min. The precursor solution was deposited on the substrate 28 by KJC-MOD. Substrate 28 was spun at 2500 RPM for 30 seconds. Substrate 28 was then placed on a hot plate and baked in air at 160° C. for 1 minute. The precursor deposition and baking steps were repeated twice more. Substrate 28 was then placed on a hot plate and baked in air at 260° C. for 4 minutes. Substrate 28 was then transferred to a rapid thermal anneal apparatus, then a rapid thermal annealing in oxygen of the substrate was conducted at 700° C. with a ramping rate of 100° C./second and a hold time of 30 seconds. The second electrode 52 of 2000 Å was then sputtered, a resist was applied, followed by a standard photo mask process, and an ion mill etch. An ashing process then followed the patterning step, then a second rapid thermal anneal was performed on substrate 28 at 700° C. for a time period of 30 seconds. The rapid-thermal anneal was performed in an oxygen atmosphere, then substrate 28 was transferred to a diffusion furnace and a furnace anneal process was performed on substrate 28 at a temperature of 700° C. for 60 minutes in an oxygen atmosphere. The final thickness of the strontium bismuth tantalate layer was 2000 Å. Additional samples were prepared under the same conditions. The second rapid thermal annealing process was performed on these additional samples in the following time periods: one sample was exposed to 0 seconds of second rapid thermal anneal; one sample was exposed to 90 seconds of second rapid thermal anneal; and one sample was exposed to 300 seconds of second rapid thermal anneal.

Figure 9:
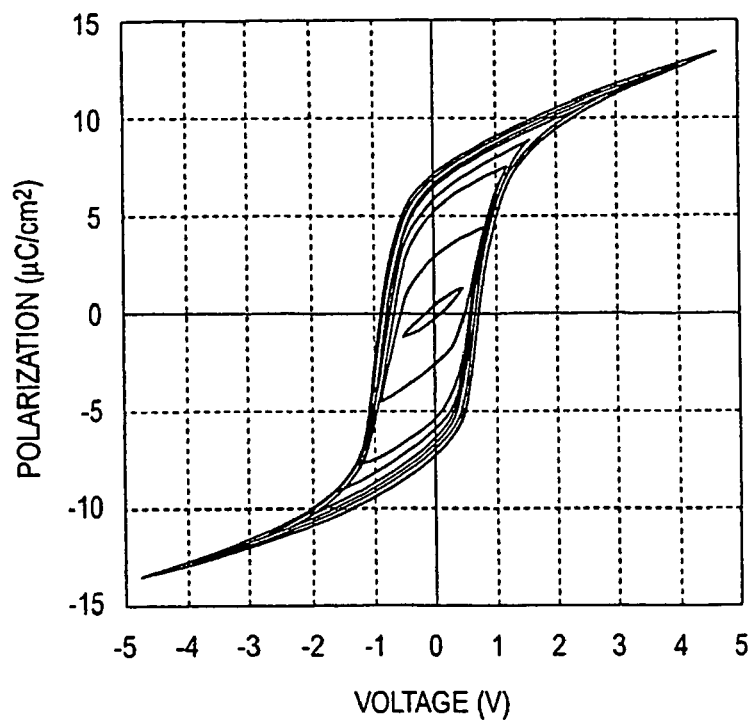
FIG. 9 depicts a graph of polarization in microcoulombs per centimeter squared versus applied voltage for a sample of $SrBi_2Ta_2O_9$ that has been treated to the second rapid thermal anneal aspect of the invention.
Figure 10:
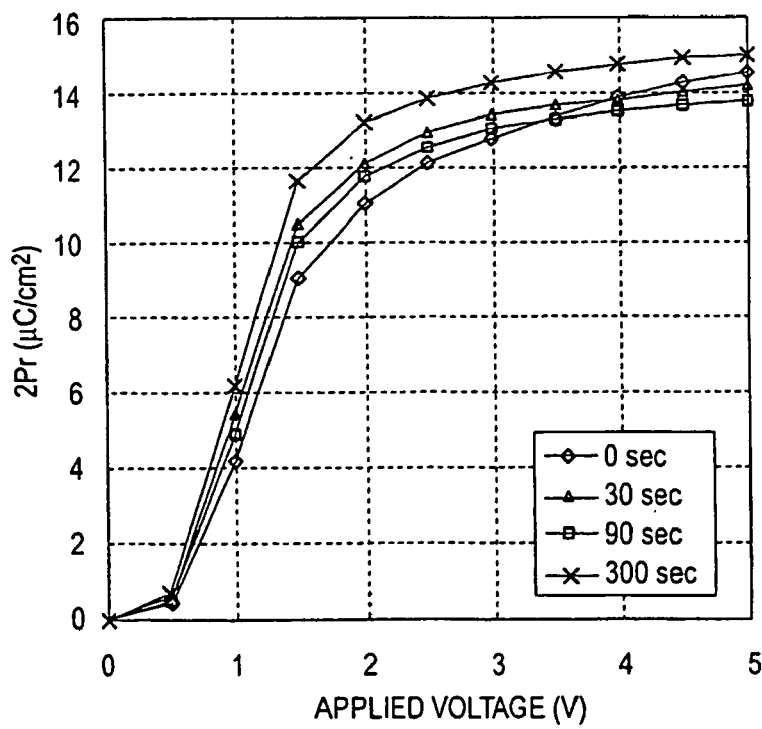
FIG. 10 depicts a graph of 2Pr versus applied voltage for a sample of $SrBi_2Ta_2O_9$ that has been treated to the second rapid thermal anneal aspect of the invention.

FIG. 9 shows the initial hysteresis curves for the $Sr_{0.9}Bi_{2.2}Ta_2O_9$ sample fabricated in Example 1. The hysteresis curve of FIG. 9 plots polarization on the y-axis in microcoulombs per centimeter squared. FIG. 9 depicts polarization measurements taken on the $Sr_{0.9}Bi_{2.2}Ta_2O_9$ sample fabricated in Example 1 at voltage cycles of ±0.5 volts, ±1 volts, ±1.5 volts, ±2 volts, ±2.5 volts, ±3 volts, ±3.5 volts, ±4 volts, ±4.5 volts, and ±5 volts. FIG. 10 is a plot of the 2Pr values versus the applied voltage for the $Sr_{0.9}Bi_{2.2}Ta_2O_9$ sample fabricated in Example 1. FIG. 10 shows that the $Sr_{0.9}Bi_{2.2}Ta_2O_9$ sample fabricated in Example 1 with 300 seconds of second rapid thermal annealing time had the greatest 2Pr, approximately 15 microcoulombs per centimeter squared.

Figure 11:
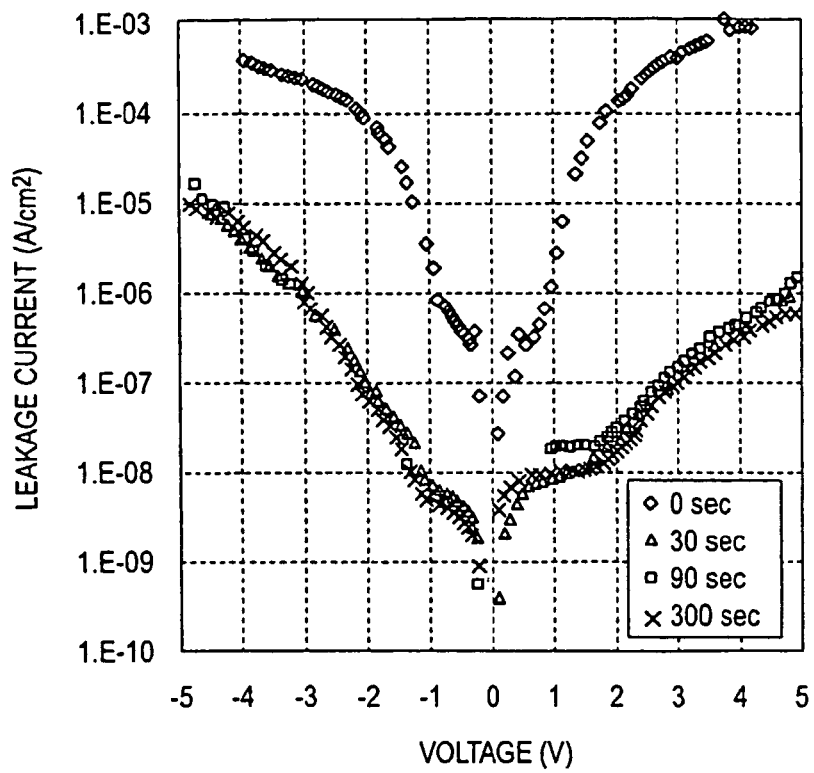
FIG. 11 depicts a graph of leakage current versus applied voltage for a sample $SrBi_2Ta_2O_9$ that has been treated to the second rapid thermal anneal aspect of the invention.
Figure 12:
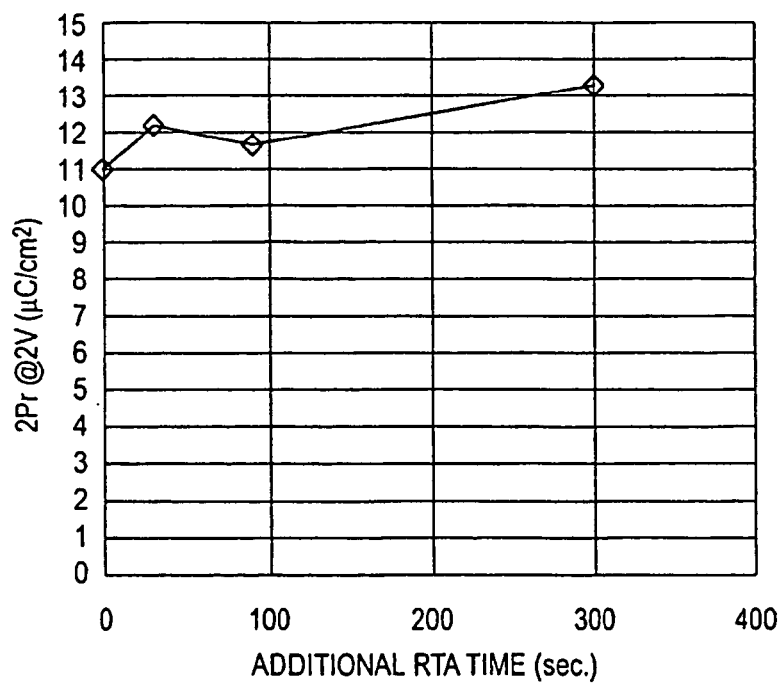
FIG. 12 depicts a graph of 2Pr versus second rapid thermal time for a sample of $SrBi_2Ta_2O_9$ that has been treated to the second rapid thermal anneal aspect of the invention.
Figure 13:
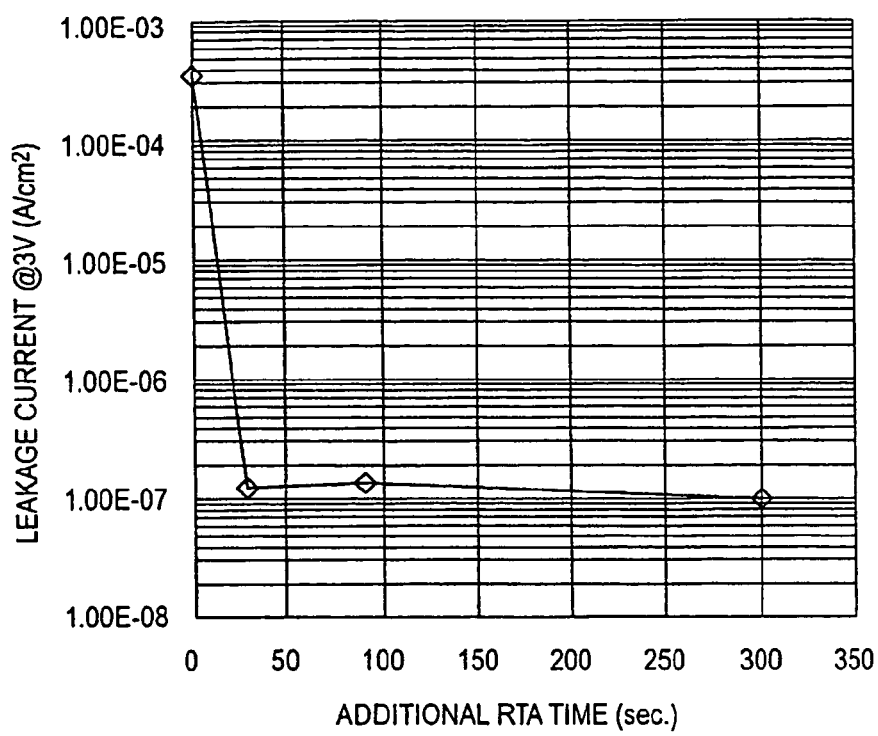
FIG. 13 depicts a graph of leakage current versus second rapid thermal anneal time for a sample of $SrBi_2Ta_2O_9$ that has been treated to the second rapid thermal anneal aspect of the invention.

FIG. 11 shows a plot of the leakage current in Amperes per centimeter square versus voltage applied. This plot shows that the amount of time exposure to the second rapid thermal anneal has an effect in decreasing the leakage current. The sample that was exposed to 300 seconds of second rapid thermal anneal time had a lower leakage current than the sample that was exposed to 0 seconds of second rapid thermal anneal time. FIG. 12 shows a plot of 2Pr versus second rapid thermal anneal time. This plot shows that the 2Pr improves with second rapid thermal anneal times of 30 seconds, 90 seconds and 300 seconds in comparison with the sample that was exposed to 0 seconds of second rapid thermal anneal time. FIG. 13 shows a plot of the leakage current in Amperes per centimeter squared versus second rapid thermal anneal time. The voltage for this plot is 3 volts. Again, it is clear that as the second rapid thermal anneal times of the sample increase, the leakage current decreases.

EXAMPLE 2

Formation of a Strontium Bismuth Tantalate Second Layer

A substrate 28 including capacitor 44 was fabricated in which layered superlattice material layer 50 was layered superlattice material, more specifically, strontium bismuth tantalate ($Sr_{0.9}Bi_{2.2}Ta_2O_9$). The precursor molarity was approximately 0.10 moles per liter. Substrate 28 comprising a single crystal silicon layer 90, a 5000 Å thick layer 92 of silicon dioxide, a 200 Å thick layer 96 of titanium, and a 2000 Å thick layer 48 of platinum was prebaked at 800° C. in a diffusion furnace for 30 minutes with an oxygen flow of 6 liters/min. The precursor solution was deposited on substrate 28 by KJC-MOD. Substrate 28 was spun at 2500 RPM for 30 seconds. Substrate 28 was then placed on a hot plate and baked in air at 160° C. for 1 minute. Substrate 28 was then baked in air at 260° C. for 4 minutes. Substrate 28 was then transferred to a rapid thermal anneal apparatus, then a rapid thermal annealing in oxygen of substrate 28 was conducted at 700° C. with a ramping rate of 100° C./second and a hold time of 30 seconds. The deposition step to the rapid thermal anneal step were repeated twice more, then substrate 28 was transferred to a deposition chamber, then a second layer of strontium bismuth tantalate was deposited on top of substrate 28 by a TOK Sol-Gel process. The sample then was transferred to a hot plate and a bake process was performed on the substrate at a temperature of 160° C. in air for 1 minute. This was followed by a second bake at a temperature of 260° C. in air for 4 minutes. Substrate 28 was then transferred to a rapid thermal anneal apparatus, then a rapid thermal annealing in oxygen of substrate 28 was conducted at 700° C. with a ramping rate of 100° C./second and a hold time of 30 seconds. An optional furnace annealing process can occur after the rapid thermal annealing process, then substrate 28 was transferred to a diffusion furnace and a furnace anneal process was performed on substrate 28 at a temperature of 700° C. in oxygen for a time of 60 seconds. Substrate 28 was then transferred to a deposition chamber and a second electrode 52 was sputtered, a resist was applied, followed by a standard photo mask process, and an ion mill etch. An ashing process then followed the patterning step. Substrate 28 was then transferred to a diffusion furnace and a furnace anneal process was performed on substrate 28 at a temperature of 700° C. for 60 minutes in an oxygen atmosphere. Finally, a standard recovery anneal was performed on substrate 28. The final thickness of the strontium bismuth tantalate layer was 1200 Å.

Figure 14:
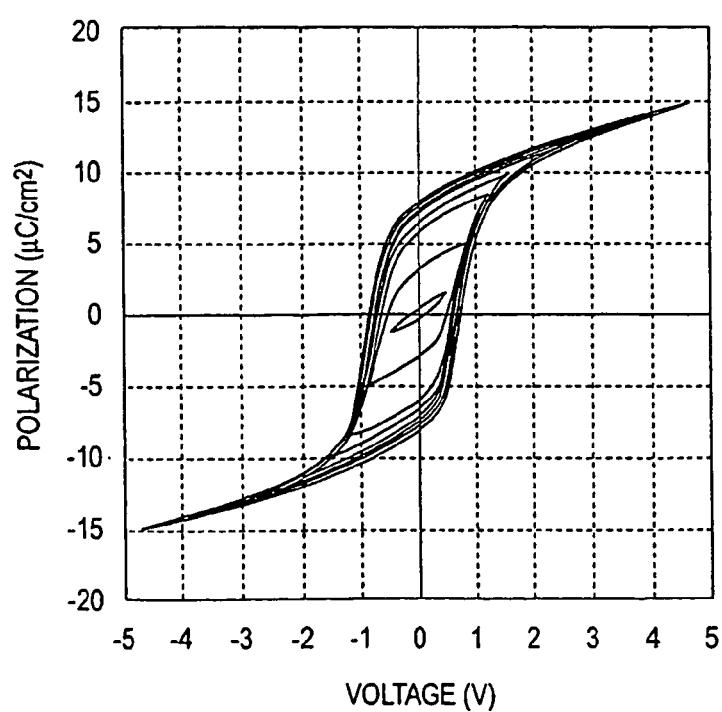
FIG. 14 depicts a hysteresis curve at ±1, ±2, ±3, ±4 and ±5 volts for a sample of $SrBi_2Ta_2O_9$ with a thin second layer of $SrBi_2Ta_2O_9$ and the final crystallizing anneal was performed after the deposition of the thin second layer.
Figure 15:
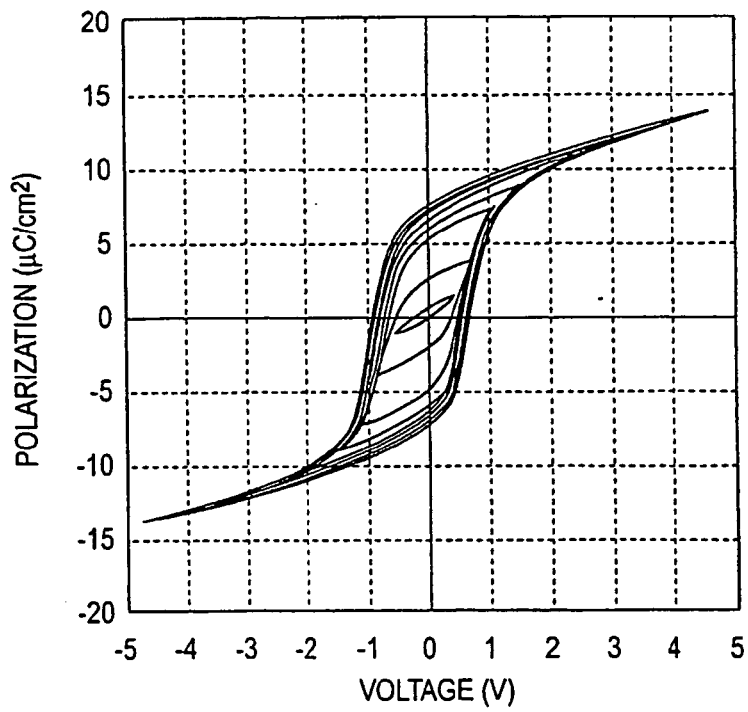
FIG. 15 depicts a hysteresis curve at ±1, ±2, ±3, ±4 and ±5 volts for a sample of $SrBi_2Ta_2O_9$ with a thin second layer of $SrBi_2Ta_2O_9$ and the final crystallizing anneal and recovery anneal was performed after the patterning process.
Figure 16:
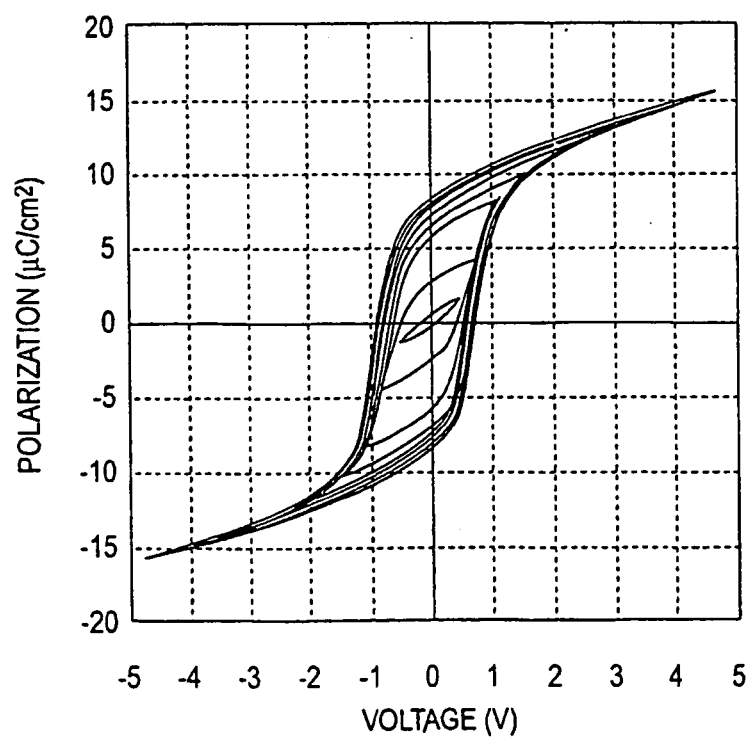
FIG. 16 depicts a hysteresis curve at ±1, ±2, ±3, ±4 and ±5 volts for a first layer of $SrBi_2Ta_2O_9$ with a second layer of $SrBi_2Ta_2O_9$ and the final crystallizing anneal was performed after the deposition of both the first layer and the second layer.
Figure 17:
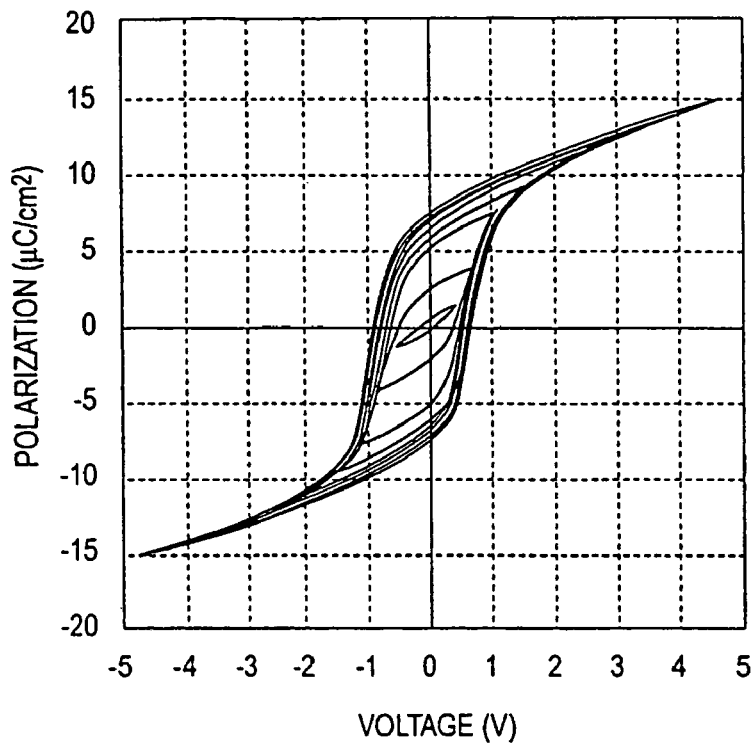
FIG. 17 depicts a hysteresis curve at ±1, ±2, ±3, ±4 and ±5 volts for a first layer of $SrBi_2Ta_2O_9$ with a second layer of $SrBi_2Ta_2O_9$ and the final crystallizing anneal was performed after the deposition of the first layer but before the deposition of the second layer.

FIG. 14 shows the initial hysteresis curves for the $Sr_{0.9}Bi_{2.2}Ta_2O_9$ sample with the strontium bismuth tantalate second layer fabricated in Example 2, with the furnace annealing step performed after the SBT second layer 132. The hysteresis curve of FIG. 14 plots polarization on the y-axis in microcoulombs per centimeter squared. FIG. 14 depicts polarization measurements taken on the $Sr_{0.9}Bi_{2.2}Ta_2O_9$ sample with the strontium bismuth tantalate second layer 132 fabricated in Example 2 at voltage cycles of ±0.5 volts, ±1 volts, ±1.5 volts, ±2 volts, ±2.5 volts, ±3 volts, ±3.5 volts, ±4 volts, ±4.5 volts, and ±5 volts. FIG. 15 shows the initial hysteresis curves for the $Sr_{0.9}Bi_{2.2}Ta_2O_9$ sample with the strontium bismuth tantalate second layer fabricated in Example 1, with the furnace annealing step performed after the patterning process. FIG. 15 depicts polarization measurements taken on the $Sr_{0.9}Bi_{2.2}Ta_2O_9$ sample with the strontium bismuth tantalate second layer 132 fabricated in Example 2 at voltage cycles of ±0.5 volts, ±1 volts, ±1.5 volts, ±2 volts, ±2.5 volts, ±3 volts, ±3.5 volts, ±4 volts, ±4.5 volts, and ±5 volts. FIG. 16 shows the initial hysteresis curves for the $Sr_{0.9}Bi_{2.2}Ta_2O_9$ sample with the strontium bismuth tantalate second layer fabricated in Example 2, with the furnace annealing step performed after the both the SBT layer 50 and the SBT second layer 132 deposition. FIG. 16 depicts polarization measurements taken on the $Sr_{0.9}Bi_{2.2}Ta_2O_9$ sample 50 with the strontium bismuth tantalate second layer 132 fabricated in Example 2 at voltage cycles of ±0.5 volts, ±1 volts, ±1.5 volts, ±2 volts, ±2.5 volts, ±3 volts, ±3.5 volts, ±4 volts, ±4.5 volts, and ±5 volts. FIG. 17 shows the initial hysteresis curves for the $Sr_{0.9}Bi_{2.2}Ta_2O_9$ sample with the strontium bismuth tantalate second layer 132 fabricated in Example 2, with the furnace annealing step performed after the SBT layer 50 deposition. FIG. 17 depicts polarization measurements taken on the $Sr_{0.9}Bi_{2.2}Ta_2O_9$ sample 50 with the strontium bismuth tantalate second layer 132 fabricated in Example 2 at voltage cycles of ±0.5 volts, ±1 volts, ±1.5 volts, ±2 volts, ±2.5 volts, ±3 volts, ±3.5 volts, ±4 volts, ±4.5 volts, and ±5 volts.

Figure 18:
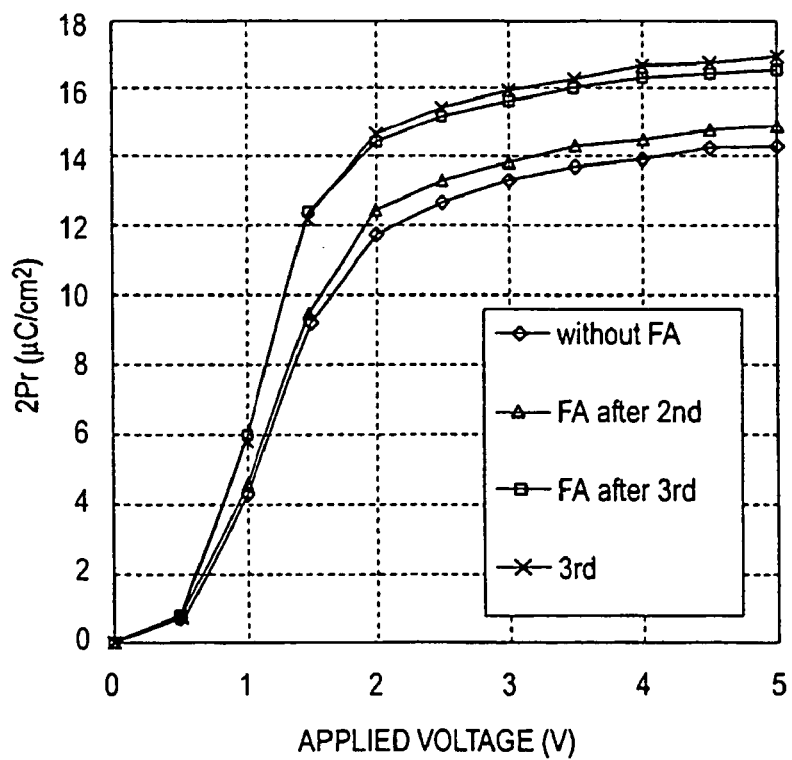
FIG. 18 depicts a graph of 2Pr versus applied voltage for a first layer of $SrBi_2Ta_2O_9$ with a second layer of $SrBi_2Ta_2O_9$ that has been treated to a final crystallizing anneal at different deposition steps in the integrated circuit fabrication process.

FIG. 18 shows a plot of the polarization 2Pr in microcoulombs per centimeter squared versus applied voltage. The plot depicts curves corresponding to when the furnace annealing processes were performed on the substrate. The curve with the largest 2Pr values is the process where the furnace annealing steps was performed after both the deposition of the SBT layer 50 and the deposition of the SBT second layer 132.

The strontium bismuth tantalate second layer produced a ferroelectric material in the capacitor of the integrated circuit that was less porous than those produced by conventional processes. The surface morphology was drastically smoother, thereby creating less problems when patterning the capacitor of the integrated circuit. Further, the polarizability of the ferroelectric material was not decreased by the fabrication process.

EXAMPLE 3

Furnace Anneal After the Patterning Process

Substrate 28, including capacitor 44, was fabricated in which layered superlattice material layer 50 was layered superlattice material, more specifically, strontium bismuth tantalate ($Sr_{0.9}Bi_{2.2}Ta_2O_9$). The precursor molarity was approximately 0.10 moles per liter. Substrate 28 comprising a single crystal silicon layer 90, a 5000 Å thick layer 92 of silicon dioxide, a 200 Å thick layer 96 of titanium, and a 2000 Å thick layer 48 of platinum was prebaked at 800° C. in a diffusion furnace for 30 minutes with an oxygen flow of 6 liters/min. The precursor solution was deposited on the substrate by KJC-MOD. Substrate 28 was spun at 2500 RPM for 30 seconds. Substrate 28 was then placed on a hot plate and baked in air at 160° C. for 1 minute. Substrate 28 was then baked in air at 260° C. for 4 minutes, then the steps of applying the precursor through the second baking step were repeated once more. Substrate 28 was then transferred to a rapid thermal anneal apparatus, then a rapid thermal annealing in oxygen of substrate 28 was conducted at 700° C. with a ramping rate of 100° C./second and a hold time of 30 seconds. Substrate 28 was then transferred to a deposition chamber and a second electrode 52 was sputtered, a resist was applied, followed by a standard photo mask process, and an ion mill etch, then a resist was applied to layered superlattice material layer 50 and first electrode 48, followed by a standard photo mask process, and an ion mill etch. Substrate 28 was then transferred to a diffusion furnace and a furnace anneal process was performed on substrate 28 at a temperature of 700° C. for 60 minutes in an oxygen atmosphere. Finally, a standard recovery anneal was performed on substrate 28. This aspect of the invention produced a smoother surface morphology, thereby decreasing the shorting problems when patterning the capacitor of the integrated circuit.

EXAMPLE 4

UV Process of Strontium Bismuth Tantalate

Substrate 28, including capacitor 44, was fabricated in which layered superlattice material layer 50 was layered superlattice material, more specifically, strontium bismuth tantalate ($Sr_{0.9}Bi_{2.2}Ta_2O_9$). The precursor molarity was approximately 0.10 moles per liter. Substrate 28 comprising a single crystal silicon layer 90, a 5000 Å thick layer 92 of silicon dioxide, a 200 Å thick layer 96 of titanium, and a 2000 Å thick layer 48 of platinum was prebaked at 800° C. in a diffusion furnace for 30 minutes with an oxygen flow of 6 liters/min. The precursor solution was deposited on Substrate 28 by KJC-MOD. Substrate 28 was spun at 2500 RPM for 30 seconds. Substrate 28 was then placed on a hot plate and baked in air at 160° C. for 1 minute while being exposed to a UV radiation source. The UV radiation source was strictly controlled and tuned to emit a UV wavelength of 260 nm. Further, the power density of the UV radiation source was controlled to 1 mW/cm$^2$. The time period of UV exposure during this baking process was 4 minutes. Substrate 28 was then baked in air at 260° C. for 4 minutes while being exposed to a UV radiation source. Again, the radiation source was controlled to the same conditions as the first baking process. Substrate 28 was then transferred to a rapid thermal anneal apparatus, then a rapid thermal annealing in oxygen of substrate 28 was conducted at 700° C. with a ramping rate of 100° C./second and a hold time of 30 seconds. The steps from deposition to rapid thermal annealing were repeated twice more. Substrate 28 was then transferred to a diffusion furnace and a furnace anneal process was performed on substrate 28 at a temperature of 700° C. in oxygen for a time period of 30 seconds, then substrate 28 was transferred to a deposition chamber and a second electrode 52 was sputtered, a resist was applied, followed by a standard photo mask process, and an ion mill etch. An ashing process then followed the patterning step. Finally, a standard recovery anneal was performed on substrate 28. This aspect of the invention produced a smoother surface morphology of the layered superlattice material in comparison to prior art fabrication processes. The layered superlattice material was less porous than those produced by prior art processes.

From the above and other examples, it has been determined that the UV budget should be within the following parameters: the wavelength should be between 200 nm to 300 nm, preferably about 260 nm; the time for application of UV should be between 1 minute and 5 minutes, preferably about 4 minutes; and the power density should be from 0.1 mW/cm$^2$ and 10 mW/cm$^2$, preferably about 1 mW/cm$^2$.

EXAMPLE 5

Formation of a Bismuth Tantalate Second Layer

Substrate 28, including capacitor 44, was fabricated in which layered superlattice material layer 50 was layered superlattice material, more specifically, strontium bismuth tantalate ($Sr_{0.9}Bi_{2.2}Ta_2O_9$). The precursor molarity was approximately 0.10 moles per liter. Substrate 28 comprising a single crystal silicon layer 90, a 5000 Å thick layer 92 of silicon dioxide, a 200 Å thick layer 96 of titanium, and a 2000 Å thick layer 48 of platinum was prebaked at 800° C. in a diffusion furnace for 30 minutes with an oxygen flow of 6 liters/min. The precursor solution was deposited on substrate 28 by KJC-MOD. Substrate 28 was spun at 2500 RPM for 30 seconds. Substrate 28 was then placed on a hot plate and baked in air at 160° C. for 1 minute. Substrate 28 was then baked in air at 260° C. for 4 minutes. Substrate 28 was then transferred to a rapid thermal anneal apparatus, then a rapid thermal annealing in oxygen of substrate 28 was conducted at 700° C. with a ramping rate of 100° C./second and a hold time of 30 seconds. The steps from deposition to rapid thermal anneal were repeated twice more, then substrate 28 was transferred to a deposition chamber.

A second layer of bismuth tantalate was then deposited on top of substrate 28 by a TOK Sol-Gel process, then the sample was transferred to a hot plate and a bake process was performed on the substrate at a temperature of 160° C. in air for 1 minute. This was followed by a second bake at a temperature of 260° C. in air for 4 minutes. Substrate 28 was then transferred to a rapid thermal anneal apparatus, then a rapid thermal annealing in oxygen of substrate 28 was conducted at 700° C. with a ramping rate of 100° C./second and a hold time of 30 seconds. An optional furnace annealing process can occur after the rapid thermal annealing process. Substrate 28 was then transferred to a diffusion furnace and a furnace anneal process was performed on substrate 28 at a temperature of 700° C. in oxygen for a time of 60 seconds, then substrate 28 was transferred to a deposition chamber and a second electrode 52 was sputtered, a resist was applied, followed by a standard photo mask process, and an ion mill etch. An ashing process then followed the patterning step. Substrate 28 was then transferred in a diffusion furnace and a furnace anneal process was performed on substrate 28 at a temperature of 700° C. for 60 minutes in an oxygen atmosphere. Finally, a standard recovery anneal was performed on substrate 28. The final thickness of the strontium bismuth tantalate layer was 1200 Å. The bismuth tantalate second layer produced a smoother layered superlattice material. The bismuth tantalate second layer produced a ferroelectric material in the capacitor of the integrated circuit that was less porous than those produced by conventional processes. The surface morphology was drastically smoother, thereby creating less problems when patterning the capacitor of the integrated circuit. Further, the polarizability of the ferroelectric material was not decreased by the fabrication process.

The modified layered superlattice material process, that is, the process in which the full crystallization anneal is not performed until after the patterning, will be a strong candidate not only to overcome the etching problem, but also to reduce the probability of shorted capacitors. This is true whether the anneal is performed after the patterning of the layered superlattice material, after the top electrode is patterned, or after a hydrogen barrier layer, inter-level dielectrics, etc., have been formed. Furthermore, employing an additional rapid thermal annealing process after the top electrode, layered superlattice material, and bottom electrode etching process is very effective for elimination of a small increase of the leakage current and slight decrease in 2Pr caused by the modified process. By using the techniques described above, maximum annealing temperature in the modified process, which was 750° C. in the prior art, can be reduced to 700° C. or less.

By employing an ultra-thin layered superlattice material top layer based on TOK Sol-Gel solution on otherwise conventional layered superlattice material thin films, some improvement of the surface morphology was confirmed, without any drop of electrical properties. This improvement did not depend on the thickness of the top layer, as was true in the case of the bismuth titanate top layer. In the case of using a TOK Sol-Gel layered superlattice material as the top layer, annealing in a furnace after the top layer deposition, or annealing in a furnace both after the base layer deposition and the top layer deposition, have equally good results. In terms of thermal budget, however, the former process will be the best one.

Electrical properties of strontium bismuth tantalate or other tantalate form of layered superlattice material thin films with a bismuth tantalate layer strongly depends on the thickness of the bismuth tantalate layer, owing to its dielectric constant. Very precise control of the bismuth tantalate film thickness is necessary. The ratio of the bismuth tantalate to the base layered superlattice material layer must by kept from 5% to 35%. After optimization of thickness of the bismuth tantalate top layer, the same 2Pr properties as those derived without a bismuth tantalate top layer and an almost flat film surface were obtained. However, the insulation breakdown voltage was drastically improved up to more than 10 volts.

The above five examples were performed with several layered superlattice materials, including strontium bismuth tantalate, strontium bismuth niobate, and strontium bismuth tantalatum niobate. The best thin film morphology was obtained with the combination of a strontium bismuth tantalum niobate base layer with a bismuth tantalate top layer. In the case of employing bismuth tantalate as the top layer, annealing in a furnace after the bismuth tantalate top layer deposition was the best process from the point of view of surface morphology, electrical properties, and thermal budget. It is noted that bismuth tantalate can be used as a hydrogen barrier layer. The advantage of bismuth tantalate is that it has the same elements as the three tantalate-type layered superlattice materials mentioned above, and further is easy to crystallize at low temperature.

The strontium/bismuth ratios of the various layered superlattice materials were also varied. Comparing the films with the strontium/bismuth ratio of 0.9/2.2 and 0.9/2.3, the more bismuth-rich base film combined with a bismuth tantalate top layer was favorable for improving the surface morphology.

UV exposure (UV wavelength is approximately 254 nm, and UV power density is 0.73 mW/cm2) during the baking process successfully resulted in improvement of the layered superlattice material surface roughness. Especially, UV exposure after the first baking process at 160° C. had a great effect on improvement of the surface morphology; however, 2Pr is reduced at the same time if too much UV is used. This phenomenon was caused by its C-axis orientation. The improvement on surface morphology was not seen until after about a UV exposure of 83 millijoules per square centimeter (mJ/cm2). After an exposure of 100 mJ/cm2, the drop of 2Pr became significant. Thus, the total energy of UV exposure has to be precisely controlled. Too little UV exposure results in no change of surface roughness, and too much UV exposure leads to a drastic drop of 2Pr. The UV energy has to be strong enough to break the bonds of any metalorganic or the other organics but not strong enough to result in C-axis orientation. Applying UV exposure to only the first layer is the best way both to improve the surface morphology and reduce the drop of 2Pr.

By employing a combination of the above-described "UV exposure process" and the above-described "bismuth tantalate top layer process", the most reliable thin strontium bismuth tantalate based films can be prepared.

There has been described what are at present considered to be the preferred embodiments of the invention. It will be understood that the invention can be embodied in other specific forms without departing from its spirit or essential characteristics. For example, while the invention has been described in terms of a silicon substrate, other substrates, such as gallium arsenide, germanium, silicon germanium, and other substrates may be used. Many other ferroelectric FET structures can be used. Further, now that the advantages and workability of a FET made with a layered superlattice material have been demonstrated, many other layered materials may be utilized. The present embodiments are, therefore, to be considered as illustrative and not restrictive. The scope of the invention is indicated by the appended claims.

We claim:

1. A method of fabricating an integrated circuit comprising:
    providing a substrate including a bottom electrode, and a precursor containing metal moieties in effective amounts for spontaneously forming a layered superlattice material upon heating said precursor;
    applying said precursor to said substrate to form a coating;
    forming a top electrode;
    patterning said bottom electrode, said coating, and said top electrode; and then
    treating said coated substrate to crystallize said thin film of layered superlattice material on said substrate; and
    completing the fabrication of said integrated circuit to include at least a portion of said layered superlattice material in an active component in said integrated circuit.

2. A method as in claim 1 wherein said step of applying said precursor to said substrate comprises applying two coats of precursor to said substrate.

3. A method as in claim 1 wherein said step of applying comprises a first baking step and a second baking step.

4. A method as in claim 3 wherein said first baking step comprises baking said substrate at a temperature not exceeding 300° C. for a time period not exceeding 60 minutes.

5. A method as in claim 3 wherein said first baking step is conducted in air.

6. A method as in claim 3 wherein said second baking step comprises baking said substrate at a temperature not exceeding 300° C. for a time period not exceeding 60 minutes.

7. A method as in claim 3 wherein said second baking step is conducted in air.

8. A method as in claim 4 wherein said temperature is in the range of from 150° C. to 170° C. for a time period of 1 minute.

9. A method as in claim 6 wherein said temperature is in the range of from 250° C. to 270° C. for a time period of 4 minutes.

10. A method as in claim 1 wherein said step of treating said substrate comprises a rapid thermal anneal.

11. A method as in claim 10 wherein said rapid thermal anneal is conducted at a temperature not exceeding 800° C. for a time period not exceeding 600 seconds.

12. A method as in claim 10 wherein said rapid thermal anneal is conducted at a temperature of between 690° C. and 710° C. for a time period between 30 seconds and 300 seconds.

13. A method as in claim 10 wherein said rapid thermal anneal is conducted in oxygen.

14. A method as in claim 1 wherein said layered superlattice material includes an A-site element, a B-site element, a superlattice generator element, and an anion.

15. A method as in claim 14 wherein said A-site element comprises one or more elements from the group consisting of strontium, calcium, barium, bismuth, cadmium, and lead.

16. A method as in claim 14 wherein said B-site element comprises one of more elements from the group consisting of titanium, tantalum, hafnium, tungsten, niobium and zirconium.

17. A method as in claim 14 wherein said superlattice generator element comprises one or more elements from the group consisting of bismuth, scandium, yttrium, lanthanum, antimony, chromium, and thallium.

18. A method as in claim 14 wherein said anion comprises an element from the group consisting of oxygen, chlorine, fluorine, and hybrids thereof.

19. A method as in claim 1 wherein said layered superlattice material comprises a solid solution of two or more of said layered superlattice materials.

20. A method as in claim 1 wherein said layered superlattice material comprises strontium bismuth tantalate.

21. A method as in claim 1 wherein said layered superlattice material contains metal atoms in molar proportion corresponding to a stoichiometric formula $Sr_aB_{ib}(Ta_{1-x}Nb_x)O_{[9+(a-1)+(b-2)(1.5)+(c-2)(2.5)]}$, where $0.8 \leq a \leq 1$, $2 \leq b \leq 2.6$, $0 \leq x \leq 0.3$, and $1.9 \leq c \leq 2.3$.

22. A method as in claim 21 wherein a=0.9, b=2.2, x=0, and c=2.0.

23. A method as in claim 1 wherein said top electrode comprises platinum.

24. A method as in claim 1 wherein said treating step comprises a crystallizing furnace anneal.

25. A method as in claim 24 wherein said crystallizing furnace anneal is conducted at a temperature of from 690° C. to 710° C. for a time period of from 40 to 80 minutes.

26. A method as in claim 25 wherein said crystallizing furnace anneal is conducted in oxygen.

27. A method of fabricating an integrated circuit comprising:
providing a substrate, a first precursor containing metal moieties in effective amounts for spontaneously forming a first thin film layered superlattice material upon heating said first precursor, and a second precursor containing metal moieties in effective amounts for spontaneously forming a second thin film layered superlattice material upon heating said second precursor, said first precursor being different than said second precursor;
applying said first precursor to said substrate to form a first coating, and thereafter applying said second precursor to said substrate to form a second coating;
treating said coatings on said substrate to form on said substrate said first thin film of layered superlattice material having a first thickness and said second thin film layered superlattice material having a second thickness, wherein the ratio of said second thickness to said first thickness ranges from 5% to 35%; and
completing the fabrication of said integrated circuit to include at least a portion of said first and second thin film layered superlattice materials in said integrated circuit.

28. A method as in claim 27 wherein said first precursor includes a compound selected from the group consisting of carboxylates and alkoxycarboxylates, and said second precursor includes an alkoxide.

29. A method as in claim 28 wherein said first precursor comprises a KCJ-MOD precursor and said second precursor comprises a TOK Sol-Gel precursor.

30. A method as in claim 29 wherein said first layered superlattice material and said second layered superlattice material comprise essentially the same layered superlattice material.

31. A method as in claim 30 wherein said ratio ranges from 10% to 30%.

32. A method as in claim 30 wherein said first layered superlattice material and said second layered superlattice material comprise strontium bismuth tantalate or strontium bismuth tantalum niobate.

33. A method as in claim 27 wherein said second layered superlattice material crystallizes at a lower temperature than said first layered superlattice material.

34. A method as in claim 27 wherein said second layered superlattice material has a higher dielectric constant than said first layered superlattice material.

35. A method as in claim 27 wherein said second layered superlattice material comprises bismuth tantalate.

36. A method as in claim 35 wherein said ratio ranges from 10% to 20%.

37. A method as in claim 27 wherein said ratio ranges from 10% to 30%.

38. A method as in claim 27 wherein said treating further comprises a first baking step and a second baking step.

39. A method as in claim 38 wherein said first baking step and said second baking step are conducted on said first thin film layered superlattice material prior to applying said second thin film layered superlattice material.

40. A method as in claim 38 wherein said first baking step and said second baking step are conducted on said second thin film layered superlattice material.

41. A method as in claim 38 wherein said first baking step comprises baking said substrate at a temperature not exceeding 300° C. for a time period not exceeding 60 minutes.

42. A method as in claim 41 wherein said temperature is 160° C. and said time period is 1 minute.

43. A method as in claim 38 wherein said second baking step comprises baking said substrate at a temperature not exceeding 300° C. for a time period not exceeding 60 minutes.

44. A method as in claim 43 wherein said temperature is 260° C. and said time period is 4 minutes.

45. A method as in claim 27 wherein said step of treating said substrate further comprises a rapid thermal anneal.

46. A method as in claim 45 wherein said rapid thermal anneal is conducted at a temperature not exceeding 800° C. for a time period not exceeding 600 seconds.

47. A method as in claim 46 wherein said rapid thermal anneal is conducted at a temperature of between 675° C. to 700° C. for a time period of 30 seconds.

48. A method as in claim 27 wherein said first and second layered superlattice materials include an A-site element, a B-site element, a superlattice generator element, and an anion.

49. A method as in claim 27, wherein said A-site element of said first and second layered superlattice materials comprises one or more elements from the group consisting of strontium, calcium, barium, bismuth, cadmium, and lead.

50. A method as in claim 27, wherein said B-site element of said first and second layered superlattice materials comprises one or more elements from the group consisting of titanium, tantalum, hafnium, tungsten, niobium and zirconium.

51. A method as in claim 27, wherein said superlattice generator element of said first and second layered superlattice materials comprises one or more elements from the group consisting of bismuth, scandium, yttrium, lanthanum, antimony, chromium, and thallium.

52. A method as in claim 27, wherein said anion of said first and second layered superlattice materials comprises an element from the group consisting of oxygen, chlorine, fluorine, and hybrids thereof.

53. A method as in claim 27, wherein said first and second layered superlattice materials comprise a solid solution of two or more of said layered superlattice materials.

54. A method as in claim 27, wherein said first and second layered superlattice materials comprise strontium bismuth tantalate.

55. A method as in claim 27, wherein said method further comprises forming an electrode after applying said second coating and patterning said electrode and said first and second coatings, and said treating further includes a crystallizing furnace anneal of said substrate after patterning of said electrode and said layered superlattice materials.

56. A method as in claim 27, wherein said treating includes a first crystallizing furnace anneal after said first precursor coating and prior to said second precursor coating and a second crystallizing furnace anneal after said second precursor coating.

57. A method of fabricating an integrated circuit comprising:
providing a substrate, a precursor containing metal moieties in effective amounts for spontaneously forming a layered superlattice material upon heating said precursor;
applying said precursor to said substrate to form a coating;

performing a first rapid thermal processing of said coating to form a solid thin film on said substrate;

forming an electrode on said solid thin film;

patterning said electrode and said solid thin film;

performing a second rapid thermal processing of said patterned electrode and said solid film to form said layered superlattice material; and completing the fabrication of said integrated circuit to include at least a portion of said layered superlattice material in an active element of said integrated circuit.

58. A method as in claim 57 wherein said first and second rapid thermal anneals are conducted at a temperature not exceeding 800° C. for a time period not exceeding 600 seconds.

59. A method as in claim 57 wherein said first rapid thermal anneal is conducted at a temperature of between 675° C. to 725° C. for a time period of 60 seconds or less.

60. A method as in claim 59 wherein said second rapid thermal anneal is conducted at a temperature of between 675° C. to 725° C. for a time period of 300 seconds or less.

61. A method as in claim 57 wherein said first and second rapid thermal anneals are conducted at a temperature of 700° C. or less.

62. A method as in claim 57 wherein said first and second rapid thermal anneals are conducted in oxygen.

63. A method as in claim 57 wherein said method further includes a crystallizing furnace anneal of said layered superlattice material after said second rapid thermal anneal.

64. A method as in claim 63 wherein said crystallizing furnace anneal is conducted at 700° C. for a period of 60 minutes.

65. A method as in claim 64 wherein said crystallizing furnace anneal is conducted in oxygen.

66. A method as in claim 57 wherein said method further comprises a first baking step and a second baking step prior to said first rapid thermal anneal.

67. A method as in claim 66 wherein said first baking step comprises baking at a temperature not exceeding 300° C. for a time period not exceeding 60 minutes.

68. A method as in claim 67 wherein said first baking step comprises baking at a temperature of 160° C. for a time period of 1 minute.

69. A method as in claim 66 wherein said second baking step comprises baking at a temperature not exceeding 300° C. for a time period not exceeding 60 minutes.

70. A method as in claim 69 wherein said second baking step comprises baking at a temperature of 260° C. for a time period of 4 minutes.

71. A method of fabricating an integrated circuit comprising:

providing a substrate, a precursor containing metal moieties in effective amounts for spontaneously forming a layered superlattice material upon heating said precursor;

applying said precursor to said substrate to form a coating; and treating said coating to form a solid film, said treating comprising applying ultraviolet radiation having an energy density between 83 mJ/cm$^2$ and 100 mJ/cm$^2$.

* * * * *